US012641780B2

(12) United States Patent
Chen

(10) Patent No.: US 12,641,780 B2
(45) Date of Patent: May 26, 2026

(54) THREE-DIMENSIONAL FLASH MEMORY DEVICE AND METHOD FOR FORMING THE SAME

(71) Applicant: Winbond Electronics Corp., Taichung City (TW)

(72) Inventor: Frederick Chen, Tainan City (TW)

(73) Assignee: Winbond Electronics Corp., Taichung City (TW)

( * ) Notice: Subject to any disclaimer, the term of this patent is extended or adjusted under 35 U.S.C. 154(b) by 701 days.

(21) Appl. No.: 18/156,977

(22) Filed: Jan. 19, 2023

(65) Prior Publication Data

US 2024/0251550 A1    Jul. 25, 2024

(51) Int. Cl.
*H10B 41/27*        (2023.01)
*H10B 41/10*        (2023.01)
*H10B 41/20*        (2023.01)

(52) U.S. Cl.
CPC ............. *H10B 41/27* (2023.02); *H10B 41/10* (2023.02); *H10B 41/20* (2023.02)

(58) Field of Classification Search
CPC ........ H10B 41/10; H10B 41/20; H10B 41/27; H10B 41/30; H10D 30/689
See application file for complete search history.

(56) References Cited

U.S. PATENT DOCUMENTS

2018/0350823 A1* 12/2018 Or-Bach ................ H10B 43/20
2019/0043960 A1    2/2019 Koval et al.
2020/0381450 A1   12/2020 Lue et al.
2022/0189990 A1    6/2022 Or-Bach et al.

FOREIGN PATENT DOCUMENTS

TW        202232738 A      8/2022
TW        202303937 A      1/2023

* cited by examiner

*Primary Examiner* — Khaja Ahmad
*Assistant Examiner* — Candice Chan
(74) *Attorney, Agent, or Firm* — MUNCY, GEISSLER, OLDS & LOWE, P.C.

(57)        ABSTRACT

A three-dimensional (3D) flash memory device is provided. The 3D flash memory device includes a substrate, a T-shaped polysilicon pillar, a select line pillar, a bit line pillar, first and second control gates, first and second floating gates, and first and second high-k dielectric pillars. The select line pillar and the bit line pillar are vertically disposed adjacent to first opposite sidewalls of the horizontally protruding portion on the substrate. The first control gate and the second control gate are positioned adjacent to second opposite sidewalls of the horizontally protruding portion. The first and second floating gates are laterally disposed between the horizontally protruding portion and the first and second control gates. The first and second high-k dielectric pillars are laterally disposed between the first floating gate and the first control gate, as well as between the second floating gate and the second control gate.

16 Claims, 22 Drawing Sheets

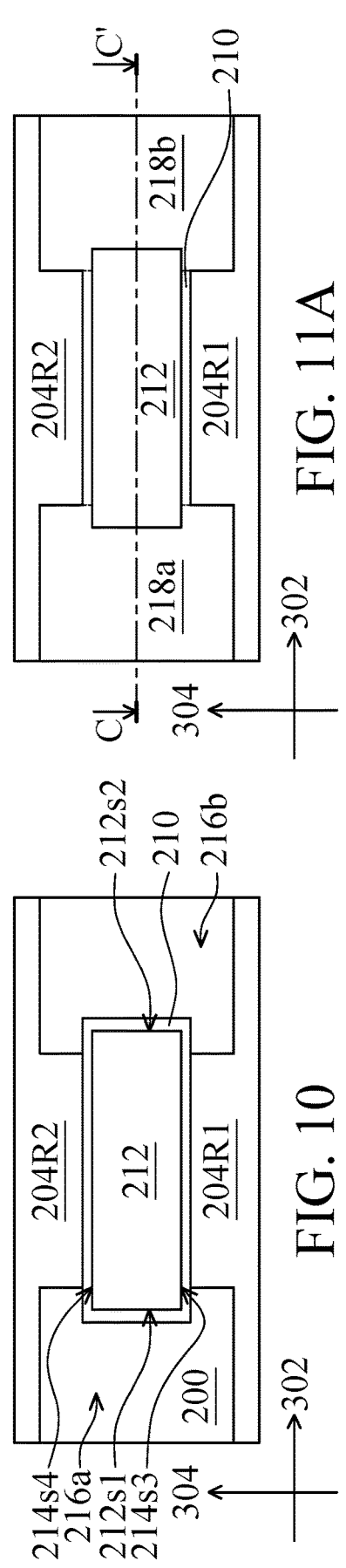
FIG. 11A
FIG. 10
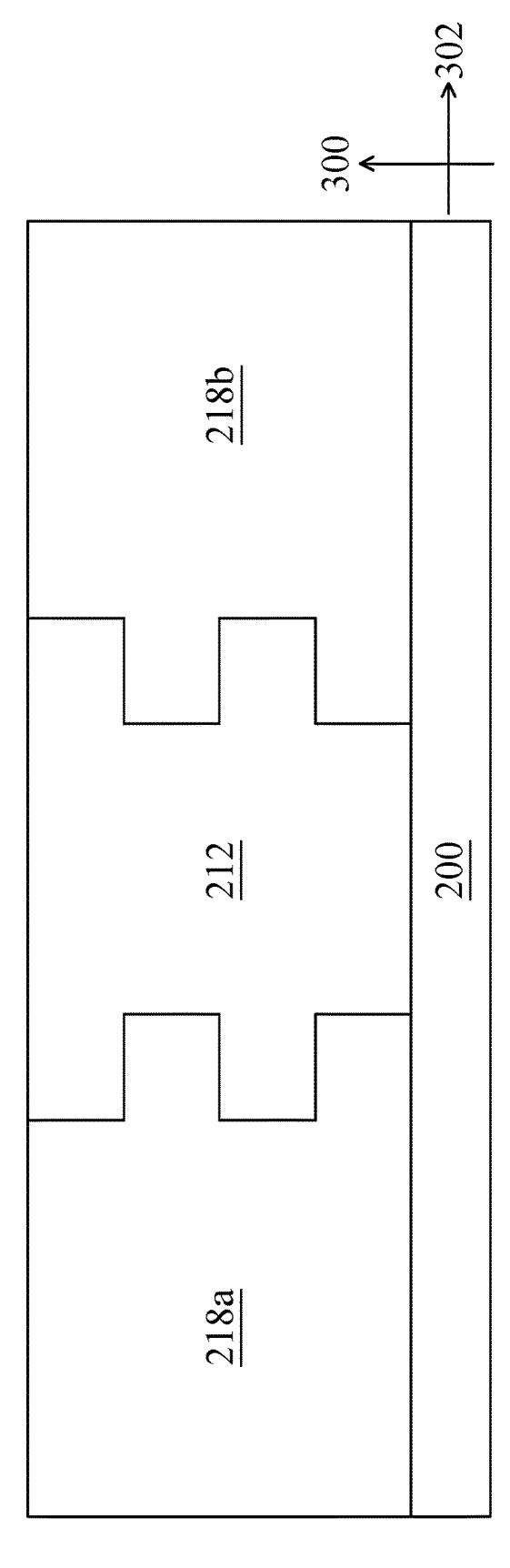
FIG. 11B

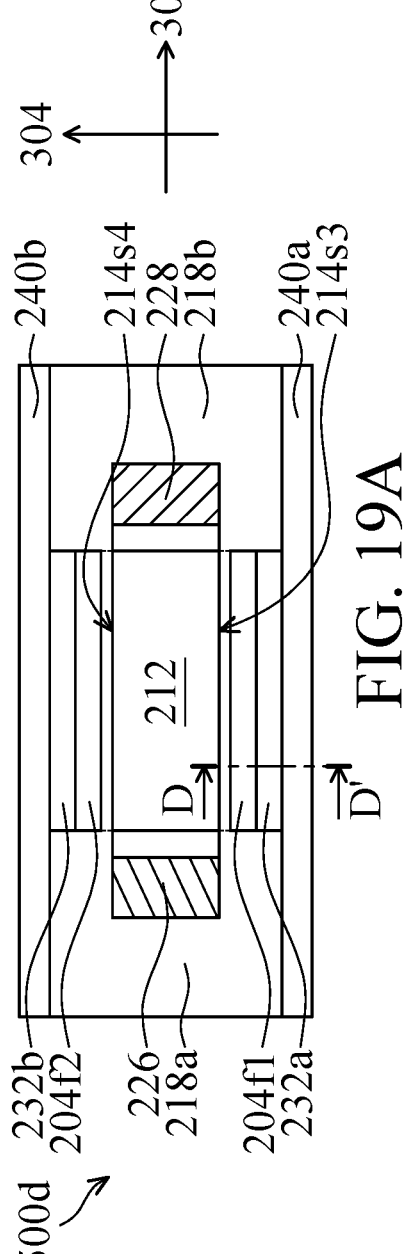
FIG. 19A
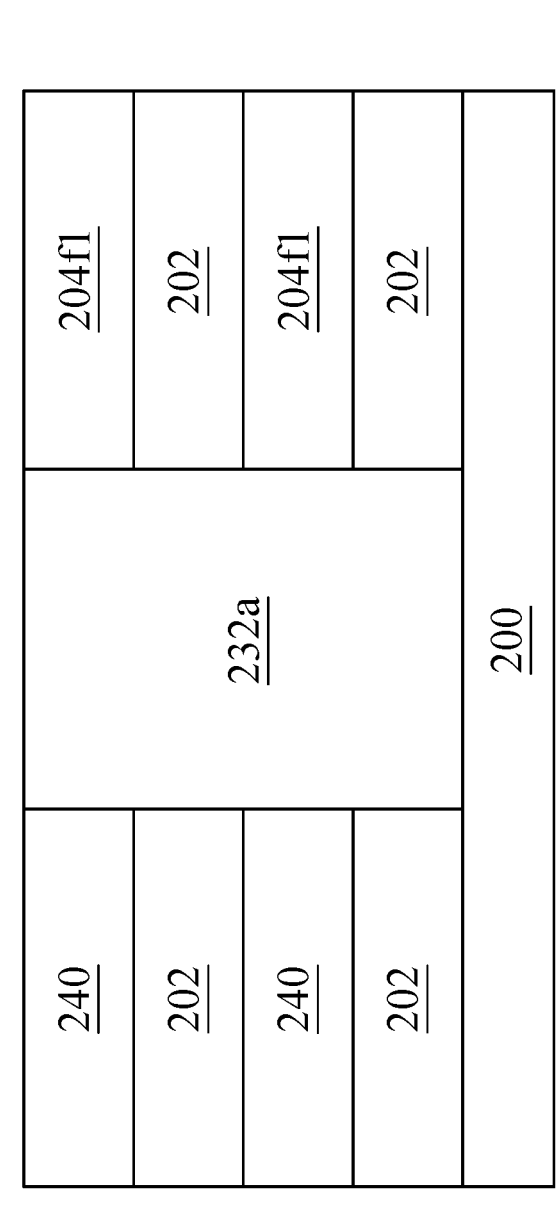
FIG. 19B
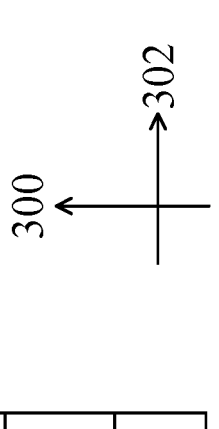

THREE-DIMENSIONAL FLASH MEMORY DEVICE AND METHOD FOR FORMING THE SAME

BACKGROUND OF THE INVENTION

Field of the Invention

The present invention relates to a three-dimensional flash memory device and a method for forming the same, and, in particular, to a three-dimensional NOR flash memory device and a method for forming the same.

Description of the Related Art

Flash memory is a non-volatile memory with large capacity, high read/write speed, low power consumption and low cost. Since flash memory is non-volatile, data can be remained in a flash memory after the flash memory has been powered off. Therefore, flash memory can be used widely.

In a NOR flash memory, the scaling-down of memory cells creates a bottleneck because of the problems that occur when decreasing the gate length and the gate width, etc. For example, the gate width of the memory cell cannot be decreased further in order to obtain high read-out current when performing read-out. The gate length of the memory cell cannot be decreased further in order to avoid the reduction of the threshold voltage (Vth). The thickness of the tunneling oxide of the memory cell cannot be shrunk further in order to avoid the short channel effect (SCE) problem. According to the reasons described above, it is becoming difficult to increase the degree of integrity of NOR flash memories and decrease the per-bit cost.

Thus, a novel three-dimensional NOR flash memory device is desirable to improve die area efficiency.

BRIEF SUMMARY OF THE INVENTION

An embodiment of the present invention provides a three-dimensional (3D) flash memory device. The 3D flash memory device comprises a substrate, a T-shaped polysilicon pillar, a select line pillar, a bit line pillar, a first control gate, a second control gate, a first floating gate, a first high-k dielectric pillar and a second high-k dielectric pillar. The T-shaped polysilicon pillar is disposed on the substrate, wherein the T-shaped polysilicon pillar comprises a horizontally protruding portion extending substantially parallel to a top surface of the substrate and a vertically extending portion extending substantially vertical to the top surface of the substrate. The select line pillar and the bit line pillar are vertically disposed on the substrate, wherein the select line pillar and the bit line pillar are adjacent to the first opposite sidewalls of the horizontally protruding portion. The first control gate and the second control gate are respectively positioned adjacent to second opposite sidewalls of the horizontally protruding portion. The first floating gate is laterally disposed between the horizontally protruding portion and the first control gate. The second floating gate is laterally disposed between the horizontally protruding portion and the second control gate. The first high-k dielectric pillar is vertically disposed on the substrate and laterally disposed between the first floating gate and the first control gate. The second high-k dielectric pillar vertically disposed on the substrate and laterally disposed between the second floating gate and the second control gate.

An embodiment of the present invention provides a 3D flash memory device. The 3D flash memory device comprises an alternating stack of insulating layers and polysilicon layers, a polysilicon pillar, first insulating pillars, a select line pillar, a bit line pillar, a first control gate, a second control gate, a first high-k dielectric pillar, and a second high-k dielectric pillar. The alternating stack is disposed over a substrate. The first insulating pillars extend through the alternating stack and adjacent to first opposite sidewalls of a horizontally protruding portion of the polysilicon pillar. The select line pillar and the bit line pillar respectively extend through the first insulating pillars and adjacent to the first opposite sidewalls of the polysilicon pillar. The first control gate and the second control gate are respectively positioned adjacent to second opposite sidewalls of the horizontally protruding portion of the polysilicon pillar and separated from the horizontally protruding portion of the polysilicon pillar by a first floating gate and a second floating gate. The first high-k dielectric pillar extends through the alternating stack and interposed between the first control gate and the first floating gate. The second high-k dielectric pillar extends through the alternating stack and interposed between the second control gate and the second floating gate.

In addition, an embodiment of the present invention provides a method for forming a 3D flash memory device. The method comprises providing a substrate. An alternating stack of insulating layers and polysilicon layers is formed over the substrate. A first trench is formed through the alternating stack by a first isotropic etching process. An etching rate of the polysilicon layers is greater than an etching rate of the insulating layers. A polysilicon pillar is formed through the alternating stack. A select line pillar and a bit line pillar are respectively formed through the alternating stack and adjacent to first opposite sidewalls of the polysilicon pillar. A first high-k dielectric pillar and a second high-k dielectric pillar are formed through the alternating stack and respectively outside second opposite sidewalls of the polysilicon pillar.

BRIEF DESCRIPTION OF THE DRAWINGS

The present invention can be more fully understood by reading the subsequent detailed description and examples with references made to the accompanying drawings, wherein:

FIGS. 7A, 7B, 8A, 8B, 9A, 9B, 10, 11A, 11B, 12A, 12B, 13A, 13B, 14A, 14B, 15A, 15B, 16A, 16B, 17A, 17B, 18A, 18B, 19A and 19B illustrate schematic top-views and cross-sectional views of intermediate stages of the method for forming the three-dimensional flash memory device in accordance with some embodiments of the disclosure.

DETAILED DESCRIPTION OF THE INVENTION

Figure 1:
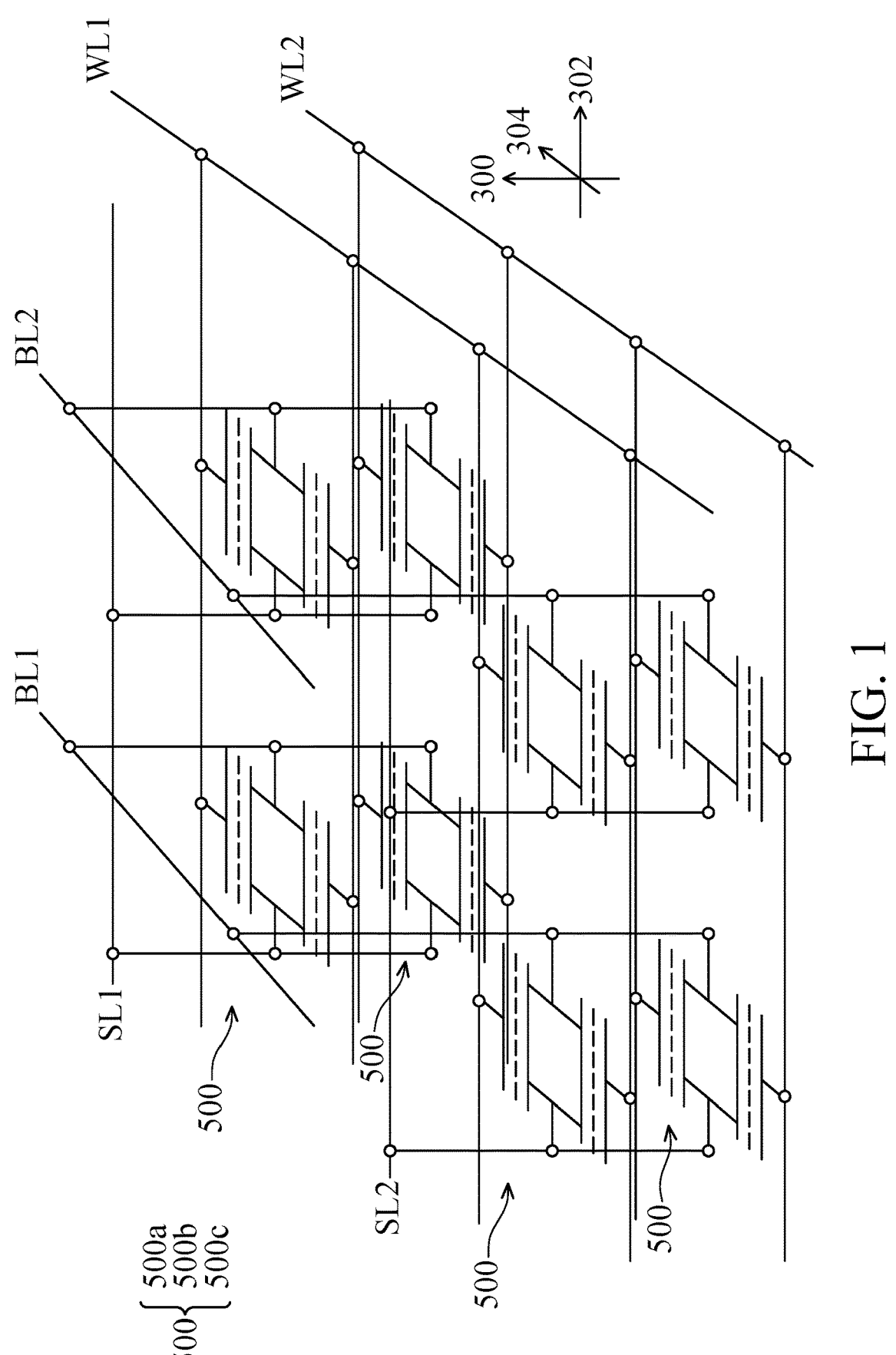
FIG. 1 illustrates a schematic circuit diagram of three-dimensional flash memory devices in accordance with some embodiments of the disclosure.

FIG. 1 illustrates a schematic circuit diagram of three-dimensional (3D) flash memory devices 500. In FIG. 1 and the following figures, directions 300, 302 and 304 are illustrated as z-direction, x-direction and y-direction, respectively. In addition, the directions 302 and 300 are respectively referred to as a lengthwise direction and a widthwise direction of the 3D flash memory devices 500.

The 3D flash memory devices 500 may be arranged as a 3D memory array. For example, the 3D flash memory devices 500 are arranged as an array in each x-y plane, and each of the 3D flash memory devices 500 in the same x-y plane is aligned to other 3D flash memory devices 500 in different layered levels in the z-direction. The 3D memory array includes bit lines BL1 and BL2, select lines SL1 and SL2 and word lines WL1 and WL2. Each cell of the 3D flash memory devices 500 is a double-gated flash memory cell having common source and drain. Sources of the 3D flash memory devices 500 in different layered levels and aligned in the direction 300 (vertically aligned) are electrically connected to the bit lines BL1 and BL2. Drains of the vertically aligned 3D flash memory devices 500 are electrically connected to the select lines SL1 and SL2. Control gates of the 3D flash memory devices 500 in the same layered level (the x-y plane) are electrically connected to the word line WL1 (or the word line WL2). A channel direction of the 3D flash memory device 500 is parallel to x-y plane. The number of the 3D flash memory devices 500 in each x-y plane and the number of layered levels in the z-direction are not limited.

Figures 2A, 2B:
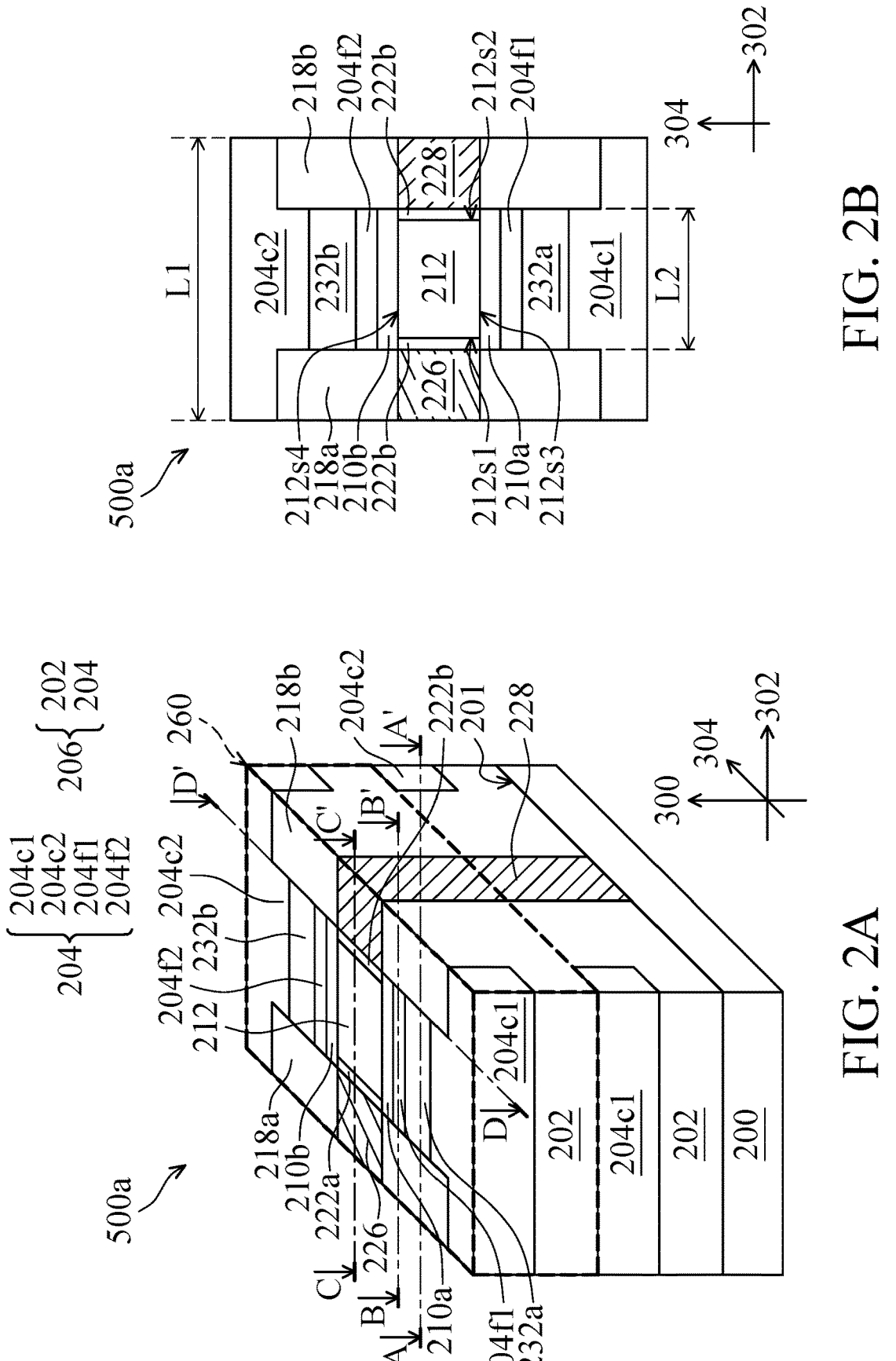
FIG. 2A illustrates a schematic perspective view of the three-dimensional flash memory device in accordance with some embodiments of the disclosure.
FIG. 2B is a top view of the three-dimensional flash memory device shown in FIG. 2A in accordance with some embodiments of the disclosure.
Figures 3A, 3B:
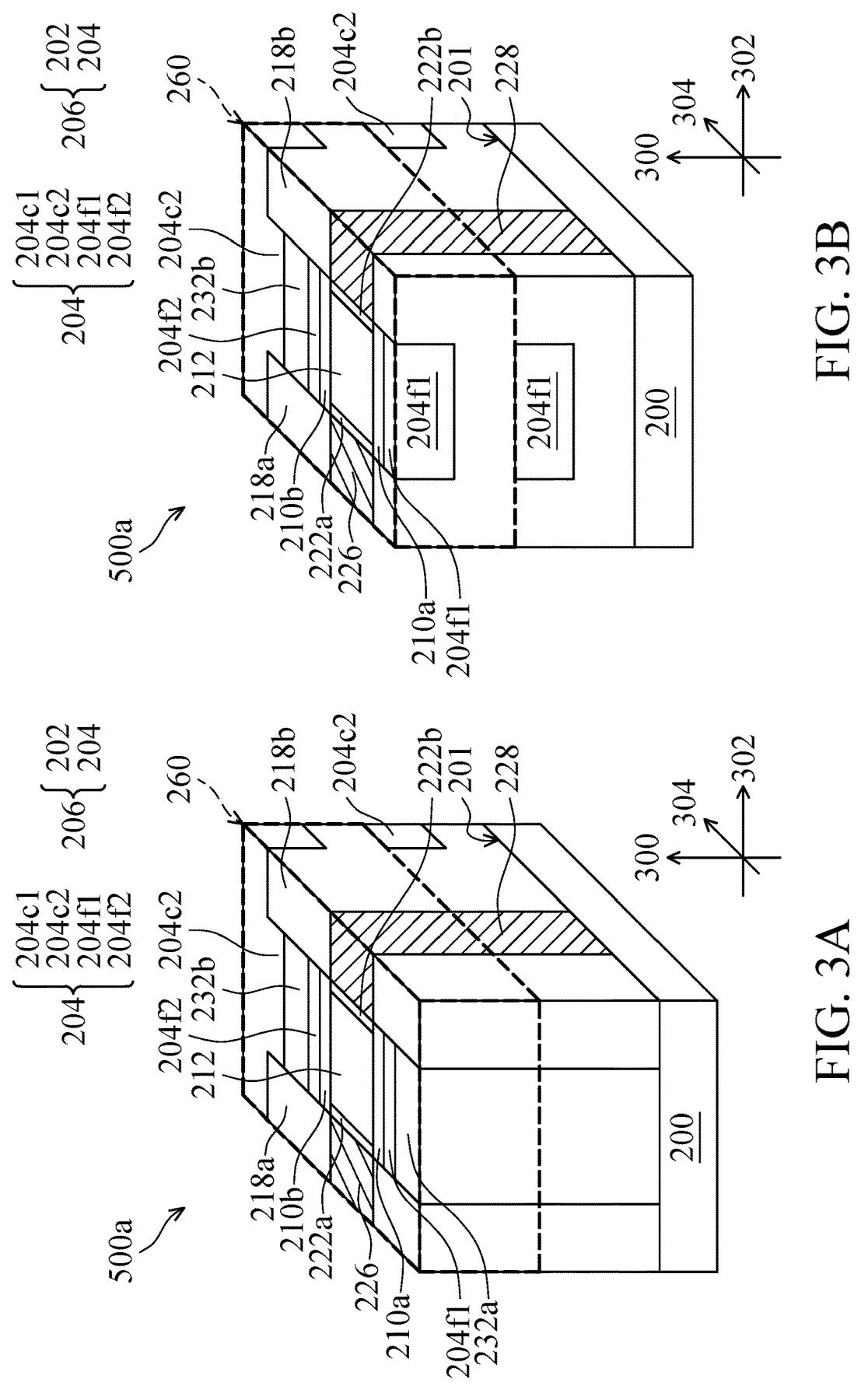
FIG. 3A illustrates a cutaway view of the three-dimensional flash memory device taken along line A-A' in FIG. 2A in accordance with some embodiments of the disclosure.
FIG. 3B illustrates a cutaway view of the three-dimensional flash memory device taken along line B-B' in FIG. 2A in accordance with some embodiments of the disclosure.
Figure 3C:
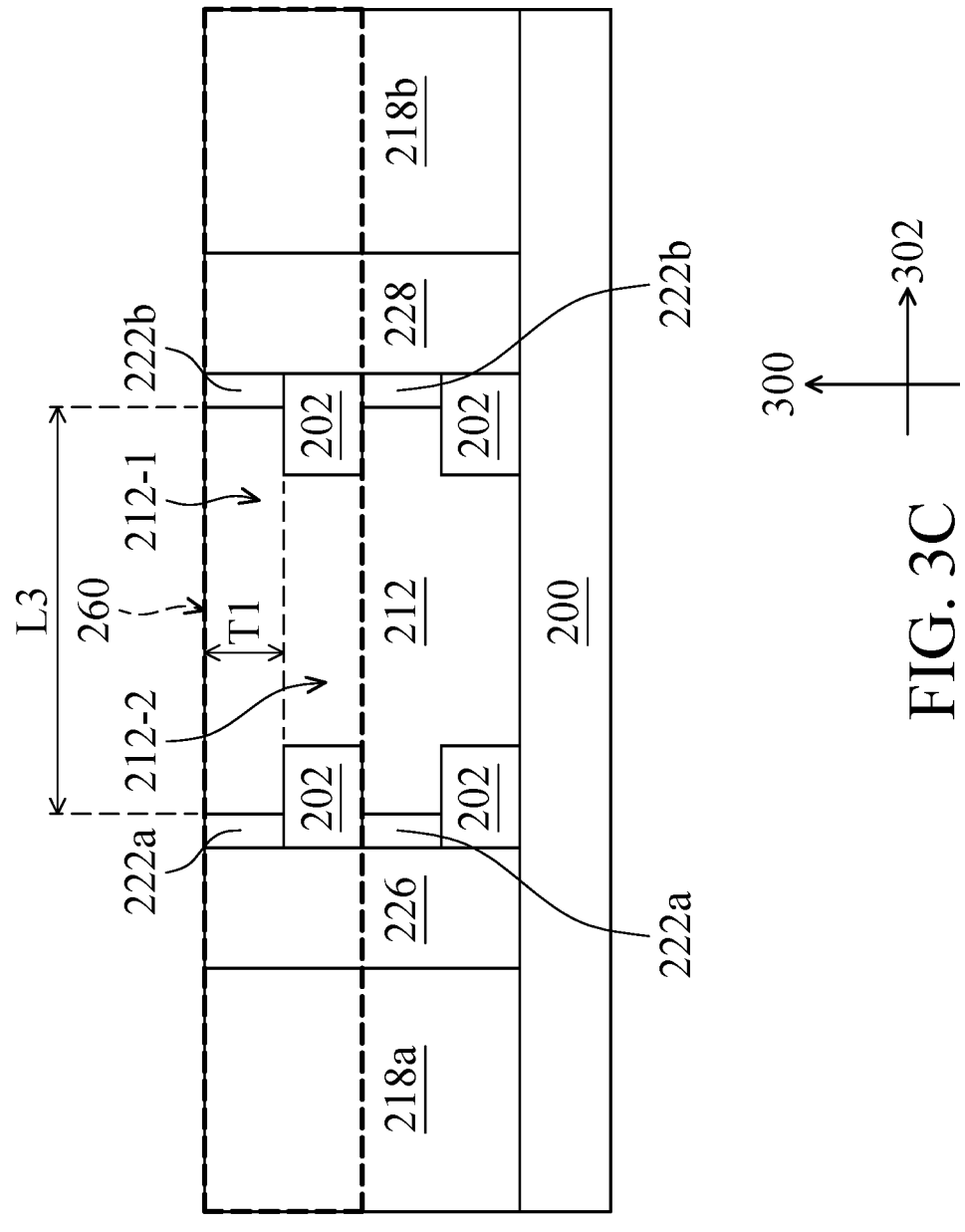
FIG. 3C illustrates a cross-sectional view of the three-dimensional flash memory device taken along line C-C' in FIG. 2A in accordance with some embodiments of the disclosure.
Figure 3D:
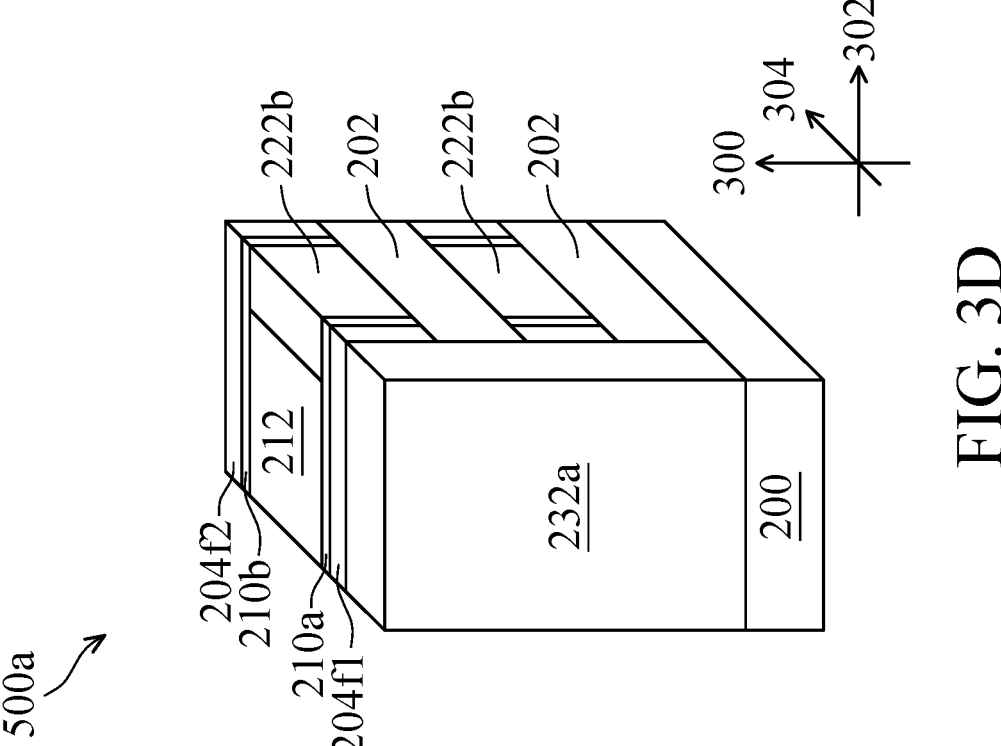
FIG. 3D illustrates a cutaway view of the three-dimensional flash memory device taken along lines A-A' and D-D' in FIG. 2A in accordance with some embodiments of the disclosure.

FIGS. 2A and 2B illustrate a schematic perspective view and a top view of a three-dimensional flash memory device 500a. FIGS. 3A, 3B and 3C illustrate cutaway views of the 3D flash memory device 500a taken along lines A-A', B-B' and in FIG. 2A C-C' in FIG. 2A. FIGS. 3A, 3B and 3C illustrate a channel region, a gate dielectric and a floating gate of the 3D flash memory device 500a. In the following figures, the direction 300 is substantially vertical to a top surface 201 of a substrate 200 (FIG. 2A). The directions 302 and 304 are substantially parallel to the top surface 201. Furthermore, the direction 302 is referred to as the lengthwise direction of the 3D flash memory devices 500a. The direction 300 is referred to as the widthwise direction of the 3D flash memory devices 500a. To clearly show the arrangement of the bit line pillar 228 of the 3D flash memory devices 500a, portions of the insulating pillar surrounding the bit line pillar 228 are not shown in FIGS. 2A, 3A, 3B and 4A.

The 3D flash memory device 500a comprises a substrate 200, a polysilicon pillar 212, a select line pillar 226, a bit line pillar 228, a first high-k dielectric pillar 232a, a second high-k dielectric pillar 232b, a first floating gate 204f1, a second floating gate 204f2, a first control gate 204c1 and a second control gate 204c2. The 3D flash memory device 500a is composed of a plurality of memory cells 260 stacked in the direction 300 on the top surface 201 of the substrate 200. For example, each memory cell 260 of the 3D flash memory device 500a may be a double-gated flash memory structure.

The 3D flash memory device 500a comprises an alternating stack 206 of insulating layers 202 and polysilicon layers 204 disposed over a substrate 200. The insulating layers 202 and the polysilicon layers 204 are alternating stacked on the substrate 200 in the direction 300. The polysilicon layer 204 may have a first conductive type (e.g., n-type). The etching rate of the polysilicon layer 204 may be higher than that of the insulating layer 202.

The polysilicon pillar 212 is disposed on the substrate 200 and extending. through the alternating stack 206 in the direction 300. The polysilicon pillar 212 serve as channel regions of the vertically stacked memory cells 260. The direction 302 is parallel to a channel length direction, and the direction 300 is parallel to a channel width direction of the 3D flash memory devices 500a. The polysilicon pillar 212 may have a second conductive type (e.g., p-type) different from the first conductive type.

The polysilicon pillar 212 may be T-shaped in a cross-sectional view. The T-shaped polysilicon pillar 212 may comprise a horizontally protruding portion 212-1 and a vertically extending portion 212-2 connecting the horizontally protruding portion 212-1 of the same memory cell 260. In addition, the vertically extending portion 212-2 of the memory cell 260 connects the horizontally protruding portion 212-1 of the underlying memory cell 260. The horizontally protruding portion 212-1 extends substantially parallel to the top surface 201. A length L3 of the horizontally protruding portion 212-1 in the direction 302 may serve as the channel length of the memory cell 260. A thickness T1 of the horizontally protruding portion 212-1 in the direction 300 may serve as the channel width of the memory cell 260. The horizontally protruding portion 212-1 has two pairs of opposite sidewalls 212s1, 212s2, 212s3 and 212s4. The opposite sidewalls 212s1 and 212s2 extend in the direction 302. The opposite sidewalls 212s3 and 212s4 extend in the direction 304. The vertically extending portion 212-2 extends substantially vertical to the top surface 201 of the substrate 200.

The 3D flash memory device 500a comprises a source electrode 222a and a drain electrode 222b close to the opposite sidewalls 212s1 and 212s2. The source electrode 222a and the drain electrode 222b may have the first conductive type (e.g., n-type). In addition, the vertically extending portion 212-2 is surrounded by one of the insulating layers 202. Therefore, the horizontally protruding portions 212-1 of the upper and lower memory cells 260 may be separated by the insulating layers 202 for improved cell isolation.

The flash memory device 500a comprises insulating pillars 218a and 218b extending through the alternating stack 206 in the direction 300. The insulating pillars 218a and 218b are respectively disposed adjacent to the opposite sidewalls 212s1 and 212s2. T The select line pillar 226 and the bit line pillar 228 are vertically disposed on the substrate 200 and respectively disposed extending through the insulating pillars 218a and 218b and adjacent to the opposite sidewalls 212s1 and 212s2. The source electrode 222a and the drain electrode 222b are in contact with the select line pillar 226 and the bit line pillar 228, respectively.

The first floating gate 204f1 and the first control gate 204c1 are disposed adjacent to the sidewall 212s3. The first control gate 204c1 is separated from the horizontally protruding portion 212-1 by the first floating gate 204f1. The second floating gate 204f2 and the second control gate 204c2 are disposed adjacent to the sidewall 212s4 of the horizontally protruding portion 212-1. The second control gate 204c2 is separated from the horizontally protruding portion 212-1 by the second floating gate 204f2. The first floating gate 204f1 is separated from the horizontally protruding portion 212-1 by a tunneling dielectric layer 210a, and the second floating gate 204f2 is separated from the horizontally protruding portion 212-1 by a tunneling dielectric layer 210b.

The first floating gate 204f1, the first control gate 204c1, the second floating gate 204f2 and the second control gate 204c2 of the same memory cell 260 are separated portions of one of the polysilicon layers 204 of the alternating stack 206 and in the same layered level. Top surfaces of the first floating gate 204f1, the first control gate 204c1, the second floating gate 204f2 and the second control gate 204c2 are coplanar with a top surface of the horizontally protruding portion 212-1 of the polysilicon pillar 212 of the same memory cell 260. One of the insulating layers 202 of the alternating stack 206 is positioned under the first floating gate 204f1, the first control gate 204c1, the second floating gate 204f2, and the second control gate 204c2 of the same memory cell 260. In some other embodiments, the first control gate 204c1 and the second control gate 204c2 are separated portions of a metal layer (not shown) adjacent to the insulating pillars 218a and 218b and disposed between the insulating layers 202 of the alternating stack 206.

The first floating gate 204f1, the first control gate 204c1, the second floating gate 204f2 and the second control gate 204c2 horizontally extend in the lengthwise direction of the horizontally protruding portion 212-1 (i.e. the direction 302). The first control gate 204c1 and the second control gate 204c may be I-shape (not shown) or T-shape in a top view. The T-shaped first control gate layer 204c1 and the second control gate layer 204c2 may improve cell isolation in x-y plane. IA length L1 of the first control gate layer 204c1 and the second control gate layer 204c2 are respectively greater than a length L2 of the first floating gate layer 204f1 and the second floating gate layer 204f2.

The first high-k dielectric pillar 232a and the second high-k dielectric pillar 232b are vertically disposed on the substrate 200 and respectively adjacent to opposite sidewalls 212s3 and 212s4. The first high-k dielectric pillar 232a and the second high-k dielectric pillar 232b are disposed extending through the alternating stack 206. The first high-k dielectric pillar 232a is positioned laterally interposed between the first floating gate 204f1 and the first control gate 204c1. The second high-k dielectric pillar 232b is positioned laterally interposed between the second floating gate 204f2 and the second control gate 204c2.

The first high-k dielectric pillar 232a and the second high-k dielectric pillar 232b comprise high-k dielectric materials having a dielectric constant (e.g., in a range from about 10 to about 25) greater than dielectric constants of silicon oxide and silicon nitride.

The first high-k dielectric pillar 232a and the second high-k dielectric pillar 232b passing through the alternating stack 206 may serve as common blocking dielectric of the memory cells 260 stacked in the direction 300. The first high-k dielectric pillar 232a and the second high-k dielectric pillar 232b may be used to replace the ONO (oxide/nitride/oxide) gate dielectric stack of the conventional flash memory device. Since the dielectric constant of the first high-k dielectric pillar 232a and the second high-k dielectric pillar 232b is much greater than the silicon oxide and silicon nitride, the wider first high-k dielectric pillar 232a and the wider second high-k dielectric pillar 232b are required to achieve the comparable capacitance value with the conventional flash memory device. Compared with the conventional 3D flash memory devices, the trenches for the first high-k dielectric pillar 232a and the second high-k dielectric pillar 232b forming therein may have the greater width (the lower aspect ratio) and easy fabricated. In addition, the 3D flash memory device 500a may have lower gate voltages for program and erase operation.

Figure 5:
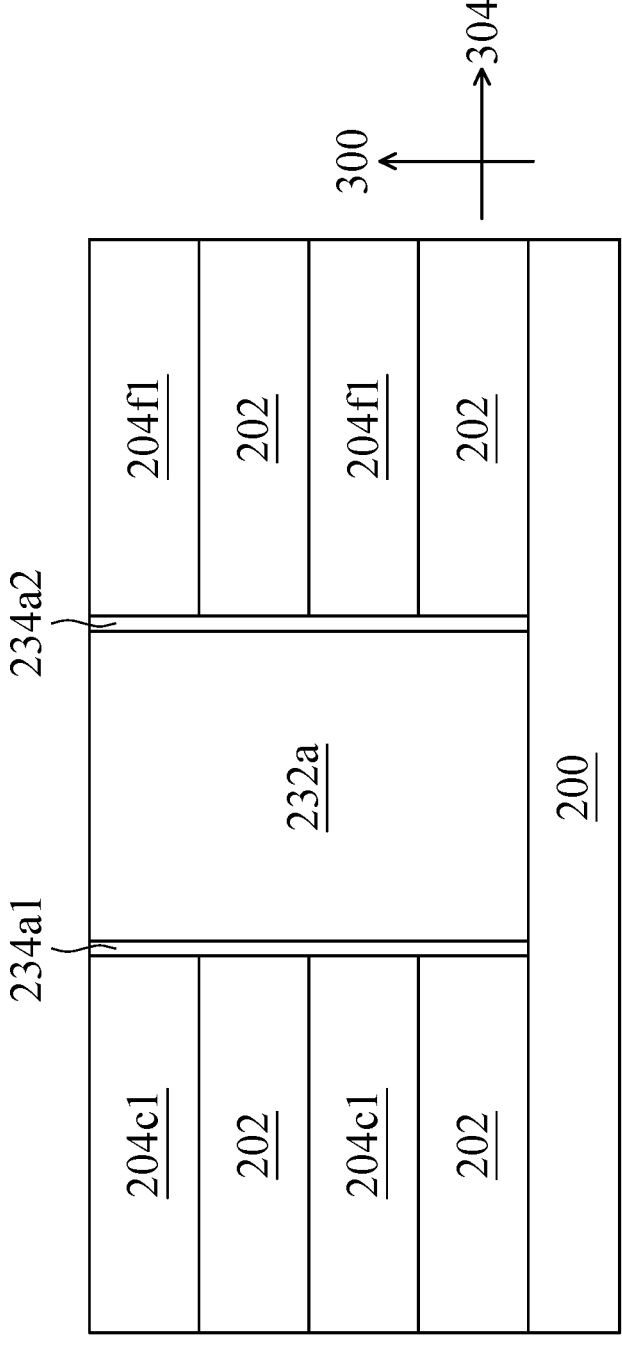
FIG. 5 illustrates a cross-sectional view of the high-k dielectric pillar and neighboring elements of a three-dimensional flash memory device taken along line D-D' in FIG. 2A in accordance with some embodiments of the disclosure.

FIG. 5 illustrates a cross-sectional view of the first high-k dielectric pillar 232a and the neighboring elements of the 3D flash memory device 500a taken along line D-D' in FIG. 2A. The second high-k dielectric pillar 232b, the first floating gate 204f1, the first control gate 204c1 may have the similar cross-sectional view. The 3D flash memory device 500a may comprise a first interfacial layer 234a1 disposed between the first floating gate 204f1 and the first high-k dielectric pillar 232a, and a second interfacial layer 234a2 disposed between the first control gate 204c1 and the first high-k dielectric pillar 232a. The first interfacial layer 234a1 and the second interfacial layer 234a2 may be positioned along opposite sidewalls of the first high-k dielectric pillar 232a. The first high-k dielectric pillar 232a is separated from the first control gate 204c1 and the first floating gate 204f1 by the first interfacial layer 234a1 and the second interfacial layer 234a2, respectively.

The dielectric constant of the first interfacial layer 234a1 and the second interfacial layer 234a2 may be lower than that of the first high-k dielectric pillar 232a. The first interfacial layer 234a1 and the second interfacial layer 234a2 may help to modify the capacitance value of a blocking dielectric (also referred to as an inter-gate dielectric) between the first floating gate 204f1 and the first control gate 204c1.

Figure 4B:
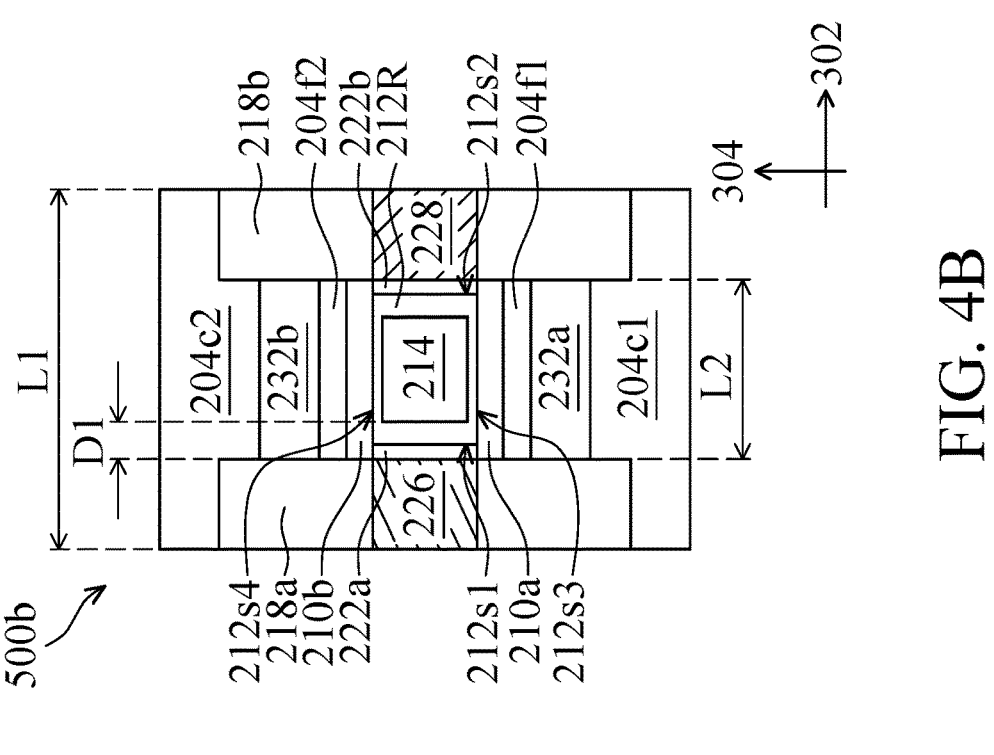
FIG. 4B is a top view of the three-dimensional flash memory device shown in FIG. 4A in accordance with some embodiments of the disclosure.
Figure 4A:
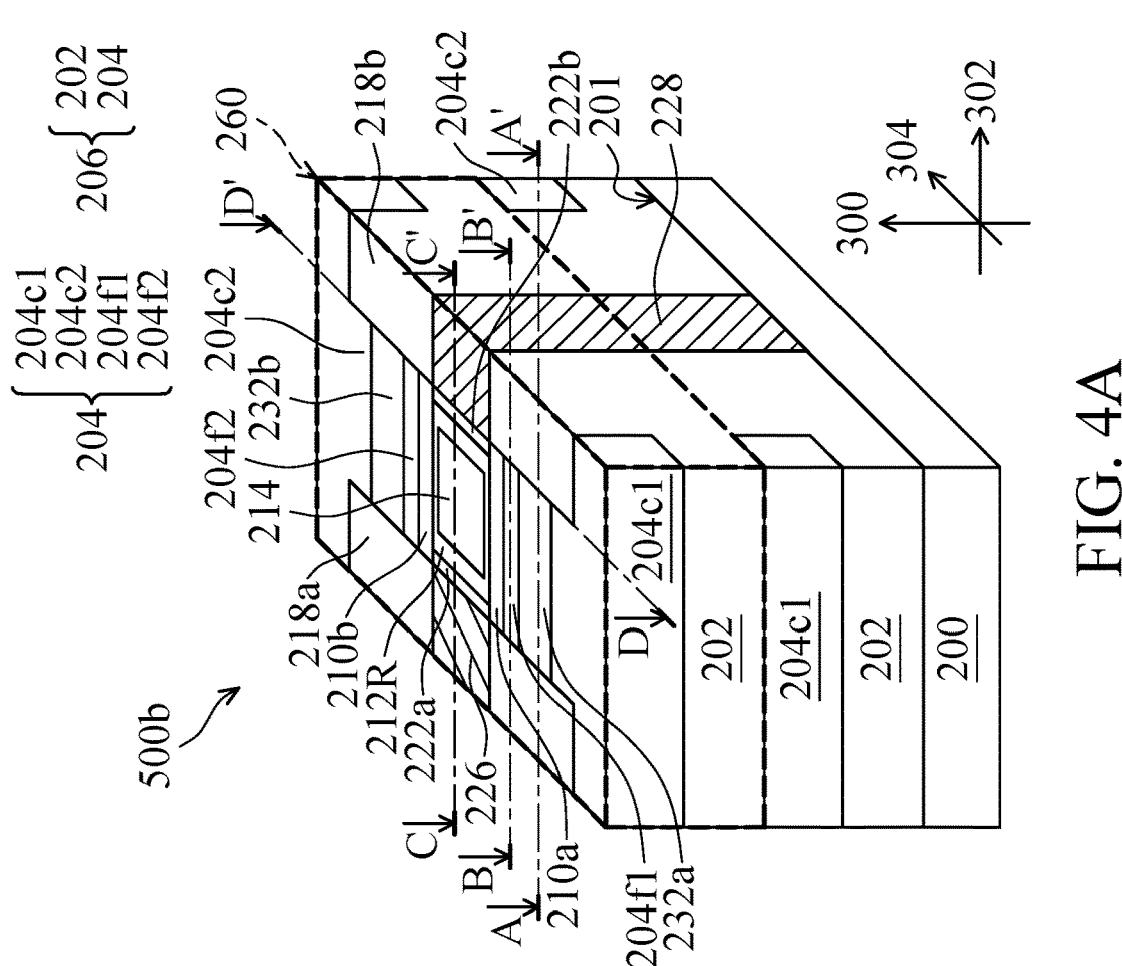
FIG. 4A illustrates a schematic perspective view of the three-dimensional flash memory device in accordance with some embodiments of the disclosure.
Figure 4C:
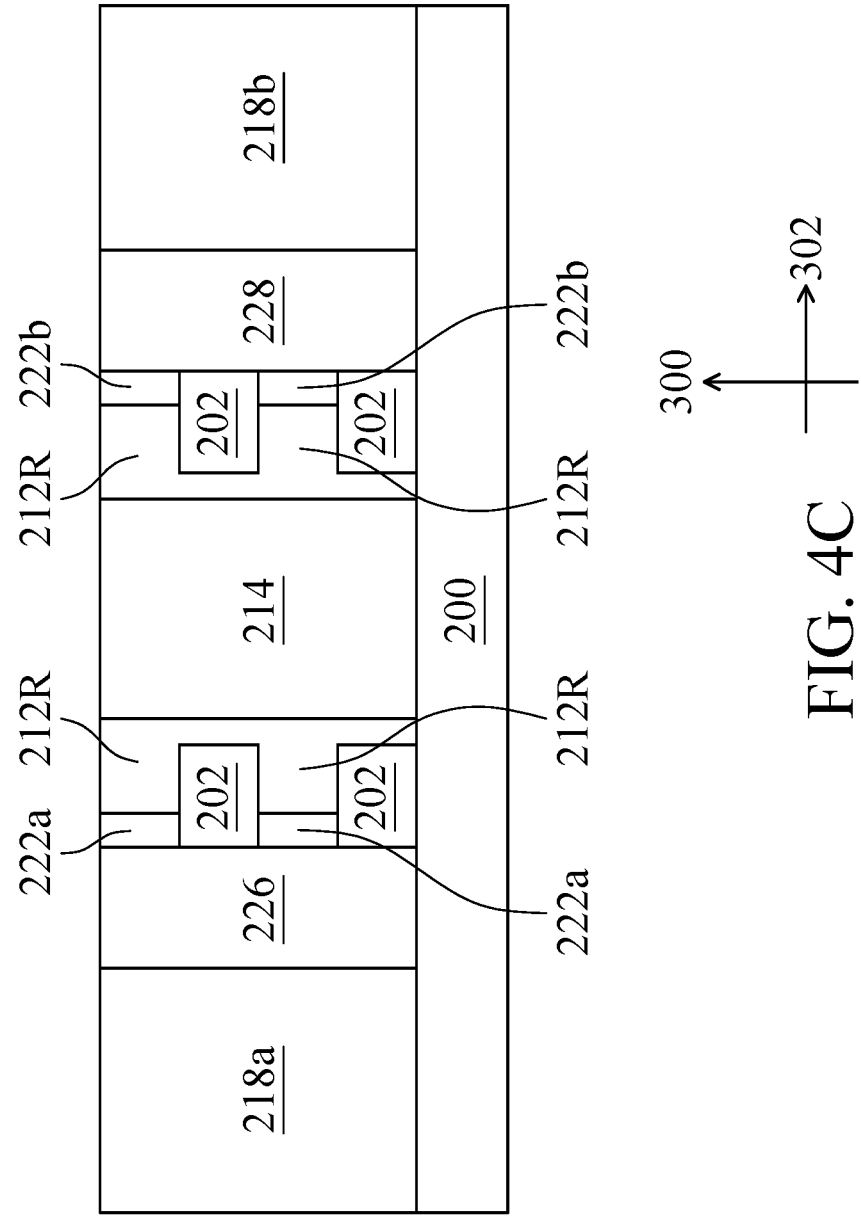
FIG. 4C illustrates a cross-sectional view of the three-dimensional flash memory device taken along line C-C' in FIG. 4A in accordance with some embodiments of the disclosure.

FIG. 4A illustrates a schematic perspective view of a three-dimensional flash memory device 500b. FIG. 4B is a top view of the 3D flash memory device 500b FIG. 4C illustrates a cross-sectional view taken along line C-C' in FIG. 4A. For clearly showing an arrangement of the bit line pillar 228 of the 3D flash memory devices 500b, portions of the insulating pillar surrounding the bit line pillar 228 is not shown in FIG. 4A.

The difference between the 3D flash memory device 500a and the 3D flash memory device 500b is that the 3D flash memory device 500b further includes an insulating pillar 214 vertically disposed on the substrate 200 and penetrating through a polysilicon pillar 212R. The polysilicon pillar 212R may have ring-shape in a top view. IA distance D1 between the insulating pillar 214 and an edge of the polysilicon pillar 212R in x-y plane is less than or equal to a 40% of a grain size of polysilicon of the polysilicon pillar 212R to avoid the current degradation phenomenon of the 3D flash memory device 500b.

Figure 6A:
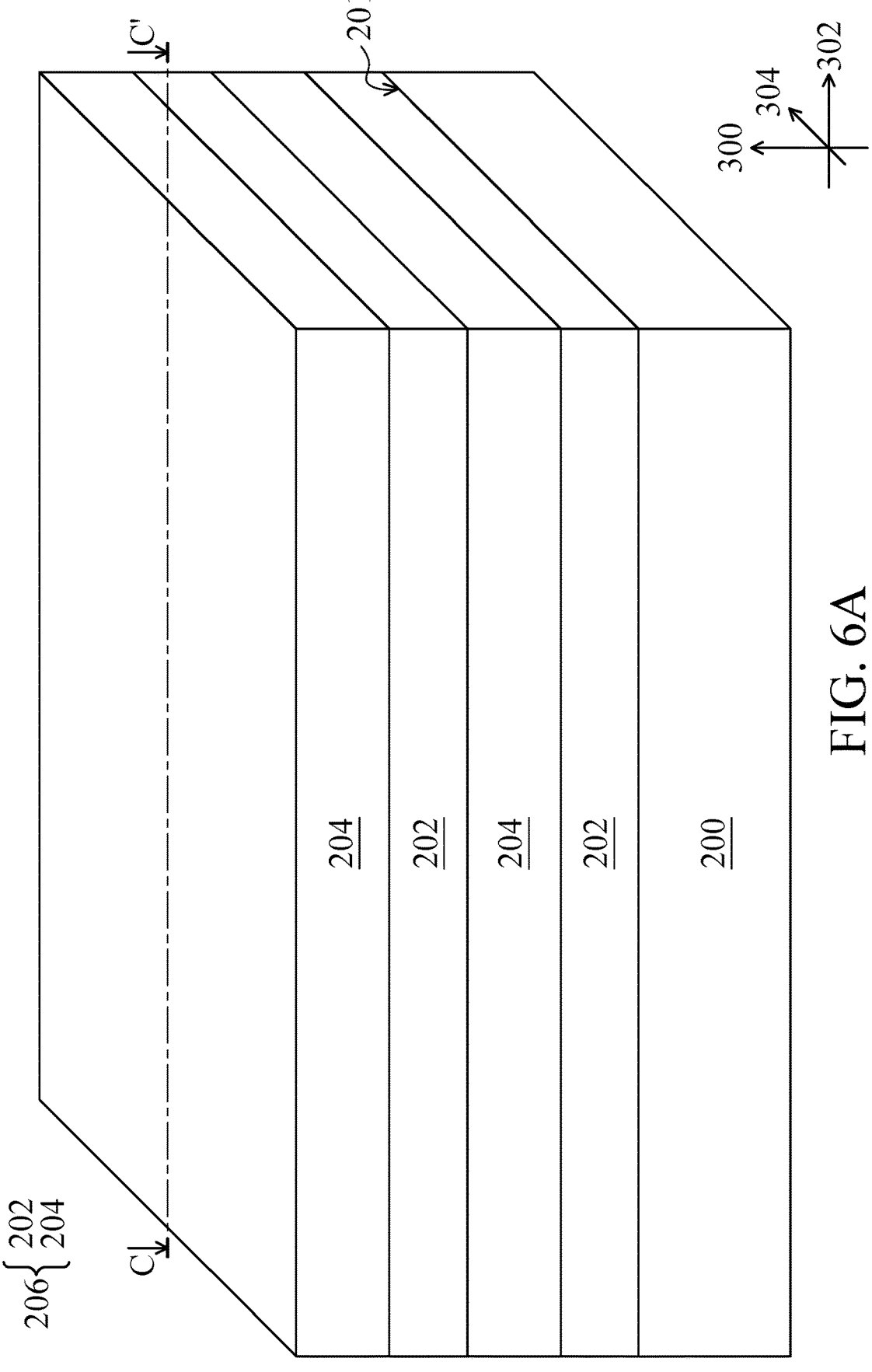
FIG. 6A illustrates a schematic perspective view of an intermediate stage of a method for forming a three-dimensional flash memory device in accordance with some embodiments of the disclosure.
Figure 6B:
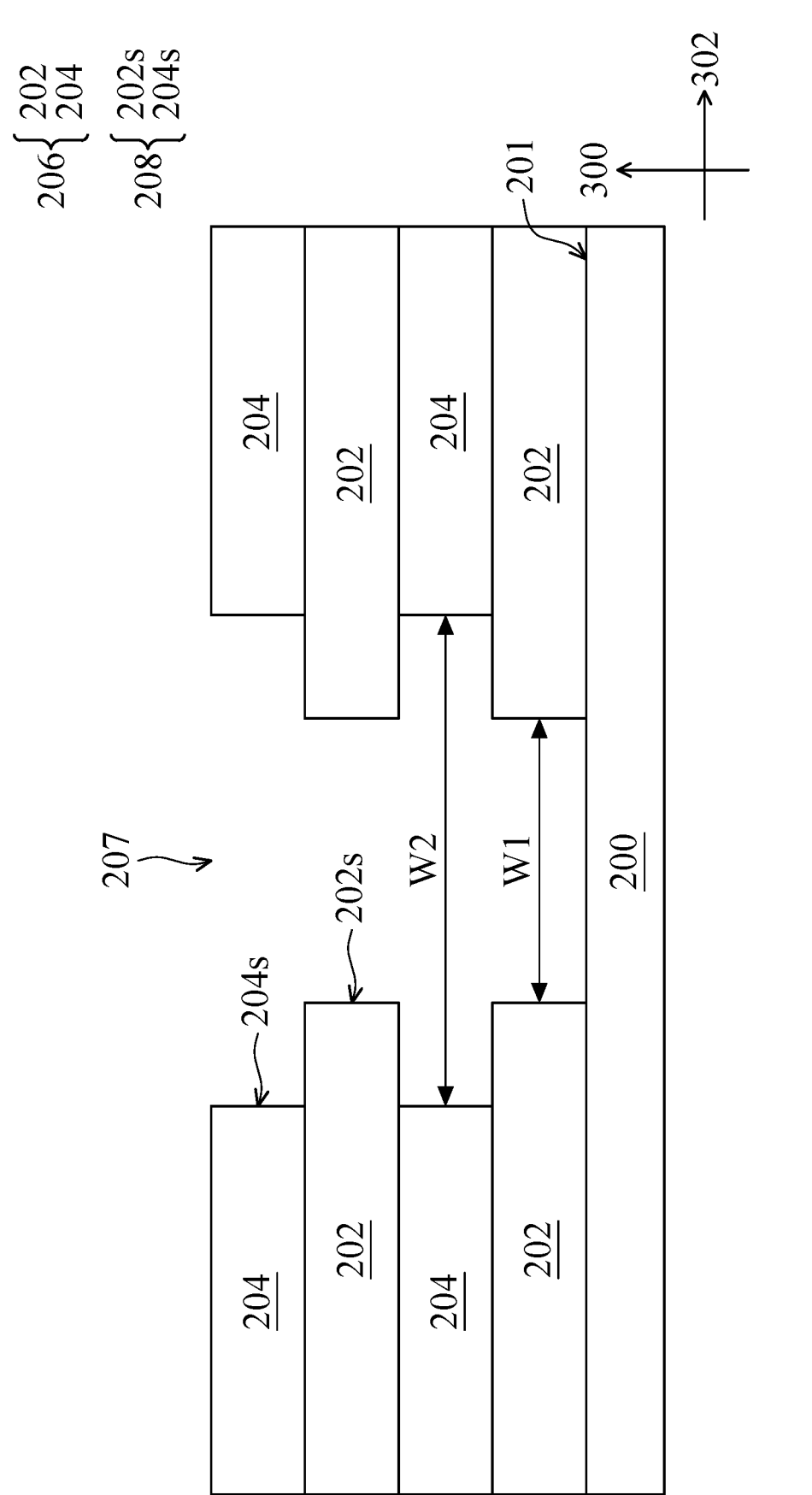
FIG. 6B illustrates a cross-sectional view of an intermediate stage of the method for forming the three-dimensional flash memory device taken along line C-C' in FIG. 6A in accordance with some embodiments of the disclosure.

FIG. 6A illustrates a schematic perspective view of an intermediate stage of a method for forming the 3D flash memory device 500. FIG. 6B illustrates a cross-sectional view taken along line C-C' in FIG. 6A. FIGS. 7A-9A, 10, 11A-19A 7B-9B and 11B-19B illustrate schematic top-views and cross-sectional views of intermediate stages of a method for forming the 3D flash memory device 500.

As shown in FIG. 6A, the method includes providing the substrate 200. The insulating layers 202 and the polysilicon layers 204 are alternately deposited on the substrate 200, such that the alternating stack 206 is formed over the substrate 200.

As shown in FIG. 6B, a trench 207 is then formed through the alternating stack 206 by an isotropic etching process until the top surface 201 of the substrate 200 is exposed. The isotropic etching process may selectively etch the polysilicon layers 204 at a higher etching rate than the insulating layers 202 of the alternating stack 206. As a result, a sidewall portion 204s of the polysilicon layers 204 may be laterally recessed from a sidewall portion 202s of the insulating layers 202. Since an etching rate of the polysilicon layers 204 is greater than an etching rate of the insulating layers 202, the width W1 is less than the width W2.

Figures 7A, 7B:
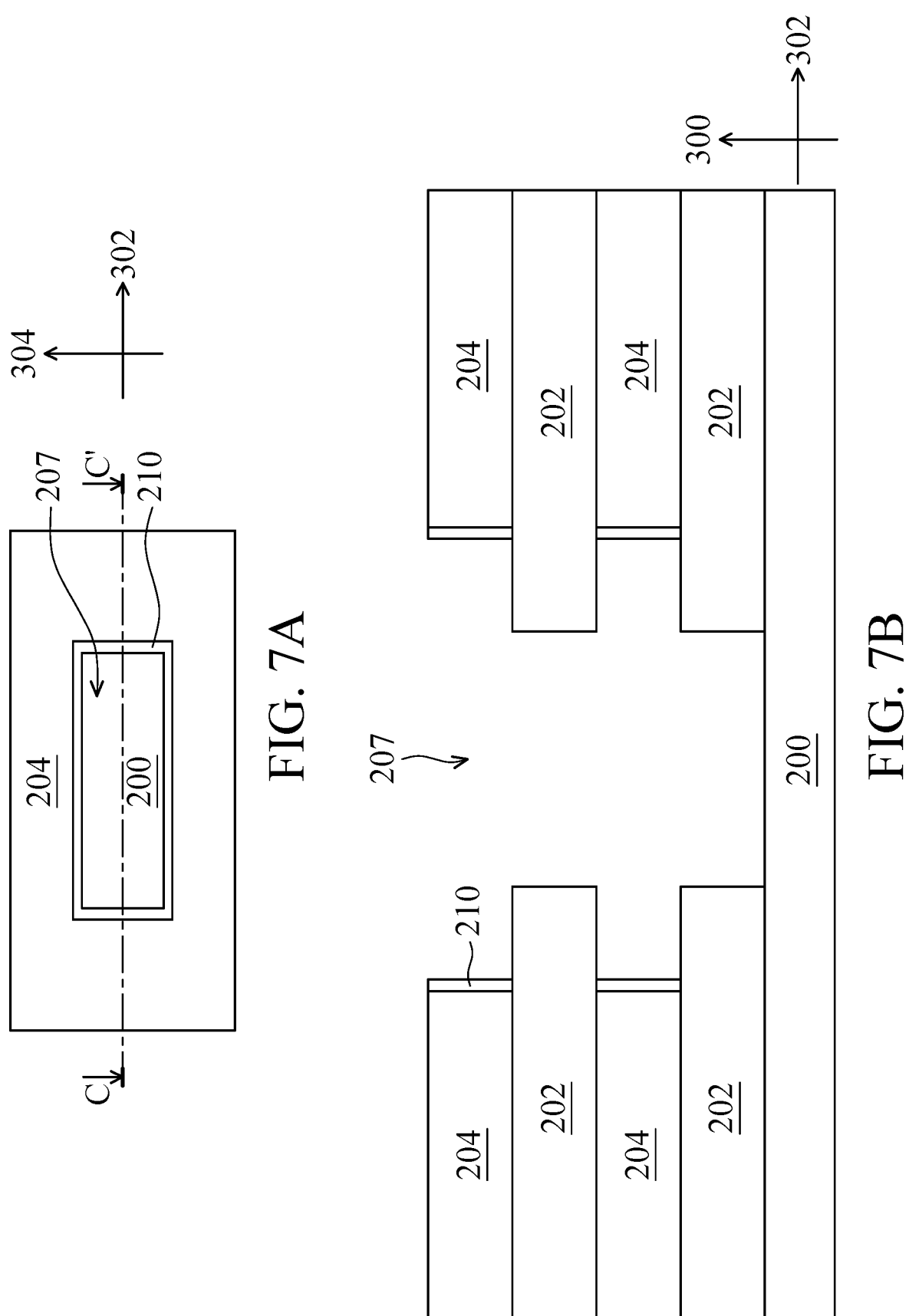

As shown in FIGS. 7A and 7B, a tunneling dielectric layer 210 is then formed lining sidewalls of the trench 207, including sidewall portions 202s and 204s. In some embodiments, the insulating layers 202 and the tunneling dielectric layer 210 comprise the same insulating material, such that no interface exists between the insulating layers 202 and the tunneling dielectric layer 210.

Figure 8A:
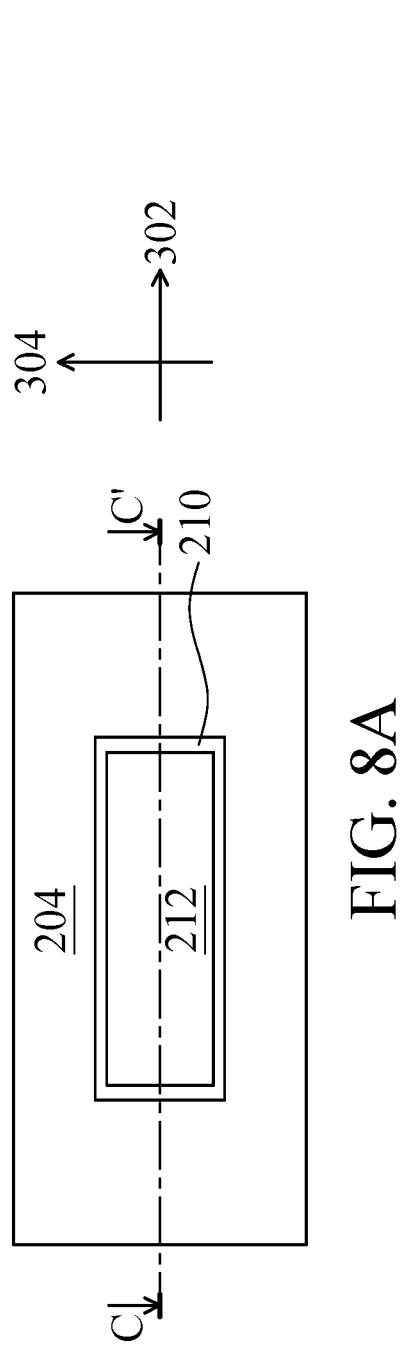
Figure 8B:
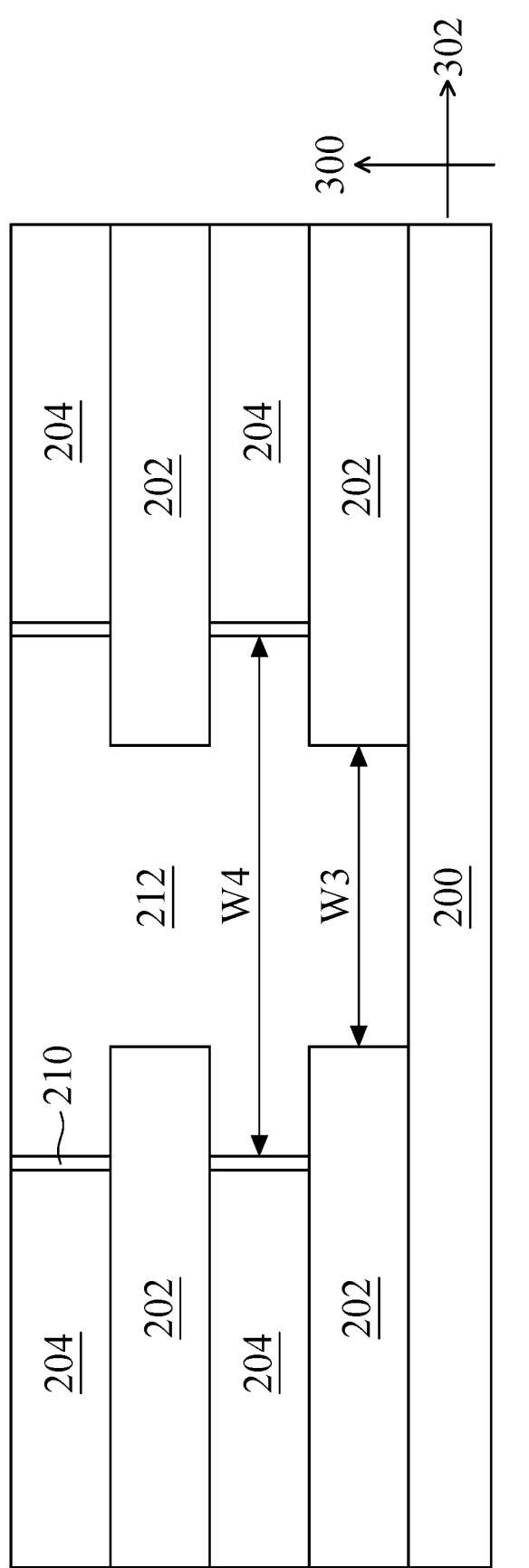

As shown in FIGS. 8A and 8B, the trench 207 is then filled with a polysilicon material to form the polysilicon pillar 212 through the alternating stack 206. A width W3 of the polysilicon pillar 212 embedded in the insulating layers 202 is less than a width W4 of the polysilicon pillar 212 embedded in the polysilicon layers 204. After forming the polysilicon pillar 212, a planarization process, such as a chemical mechanical polishing (CMP) process, may be performed to level a top surface of the polysilicon pillar 212 with a top surface of the alternating stack 206.

Figures 9A, 9B:
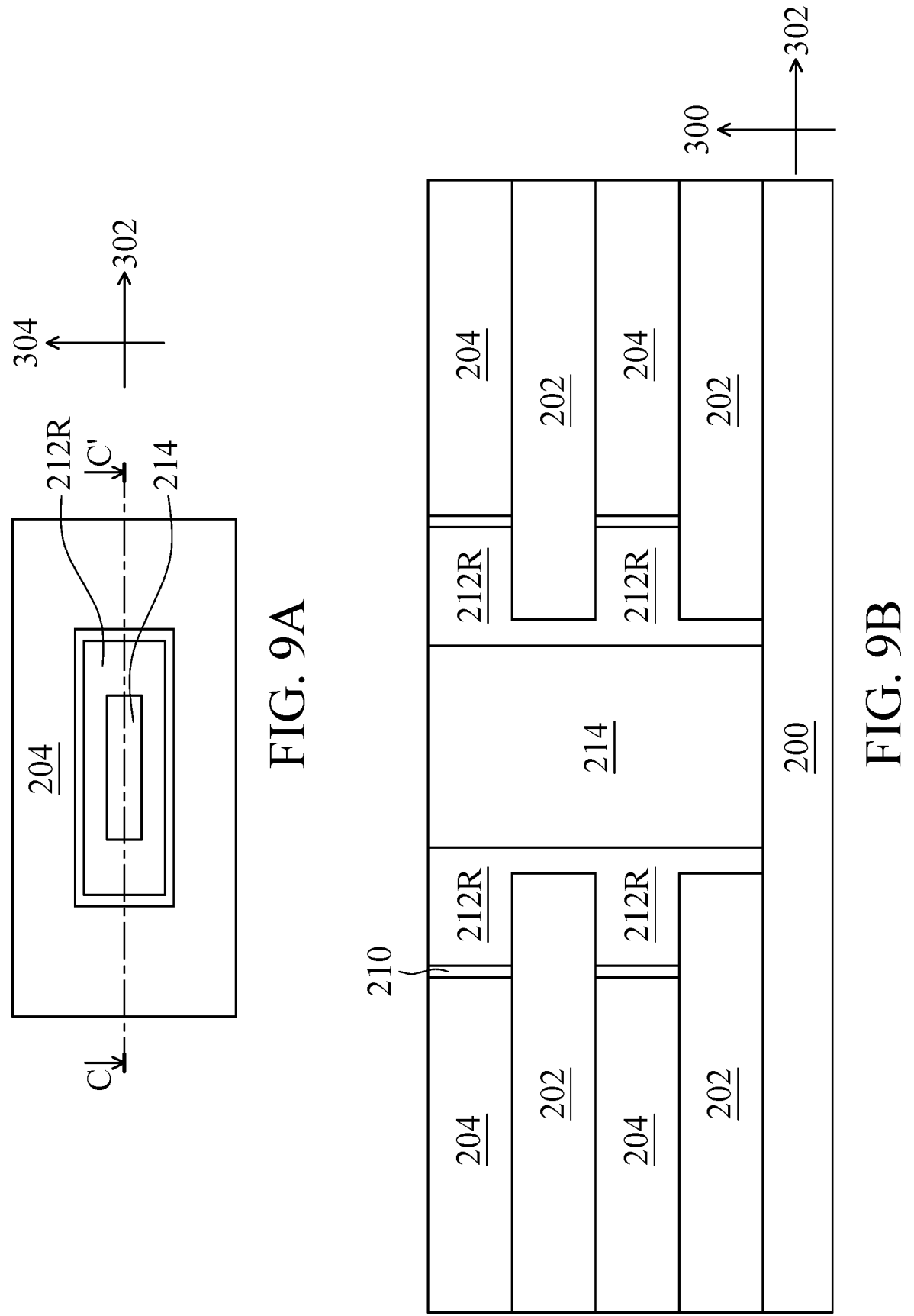

As shown in FIGS. 9A and 9B, a central portion of the polysilicon pillar 212 is optionally replaced with an insulating pillar 214. The central portion of the polysilicon pillar 212 is removed as illustrated in FIGS. 9A and 9B, annotated as 212R, to form a trench (not shown) therein. Next, the insulating pillar 214 is formed filling the trench and extending through the polysilicon pillar 212R. The formation of the insulating pillar 214 help to reduce the thickness of the polysilicon pillar 212R (i.e. the distance D1 shown in FIG. 4B) in x-y plane. After forming the insulating pillar 214, a planarization process, such as a CMP, may be performed to level a top surface of the insulating pillar 214 with the top surfaces of the polysilicon pillar 212R and the alternating stack 206.

As shown in FIG. 10, portions of the alternating stack 206 outside the opposite sidewalls 212s1 and 212s2 are removed to form trenches 216a and 216b until the substrate 200 is exposed using an anisotropic etching process. The trenches 216a and 216b define positions of the select line (the select line pillar 226) and the bit line (the bit line pillar 228). The etched polysilicon layers 204 are annotated as polysilicon layers 204R1 and 204R2, which shave T-shape in the top view.

As shown in FIGS. 11A and 11B, the insulating pillars 218a and 218b are then formed through the alternating stack 206 and adjacent to the opposite sidewalls 212s1 and 212s2.

Figures 12A, 12B:
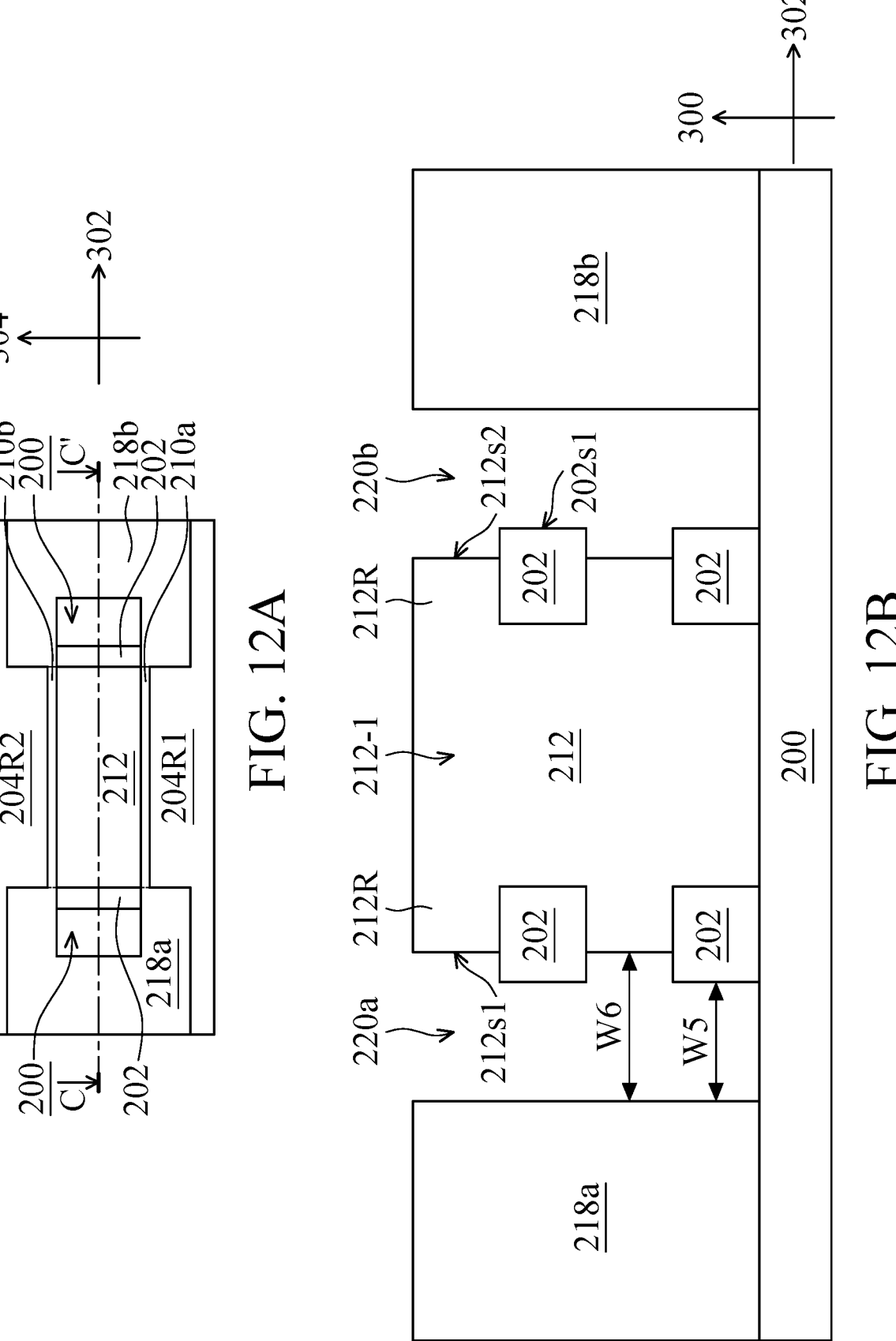

As shown in FIGS. 12A and 12B, portions of the insulating pillars 218a and 218b and the tunneling dielectric layer 210 are removed to form trenches 220a and 220b through the insulating pillars 218a and 218b using an isotropic etching process until the substrate 200 is exposed. The trenches 220a and 220b are formed adjacent to the opposite sidewalls 212s1 and 212s2, such that the horizontally protruding portions 212-1 are exposed from sidewalls of the trenches 220a and 220b. The isotropic etching process may also remove portions of the horizontally protruding portions 212-1 of the polysilicon pillar 212 and the insulating layers 202 of the alternating stack 206. In addition, the isotropic etching process may selectively etch the polysilicon pillar 212 at a higher etching rate than the insulating pillars 218a and 218b and the insulating layers 202 of the alternating stack 206. As a result, the sidewalls 212s1 and 212s2 of the polysilicon pillar 212 may be laterally recessed from sidewalls 202s1 of the etched insulating layers 202. The trenches 220a and 220b have a width W5 between the insulating pillar 218a (or the insulating pillar 218b) and the insulating layers 202, the trenches 220a and 220b have a width W6 between the insulating pillar 218a (or the insulating pillar 218b) and the horizontally protruding portions 212-1. Since the etching rate of the polysilicon pillar 212 is greater than the etching rate of the insulating layers 202, the width W5 is less than the width W6.

After forming the trenches 220a and 220b, remaining portions of the tunneling dielectric layer 210 are annotated as the tunneling dielectric layers 210a and 210b.

Figures 13A, 13B:
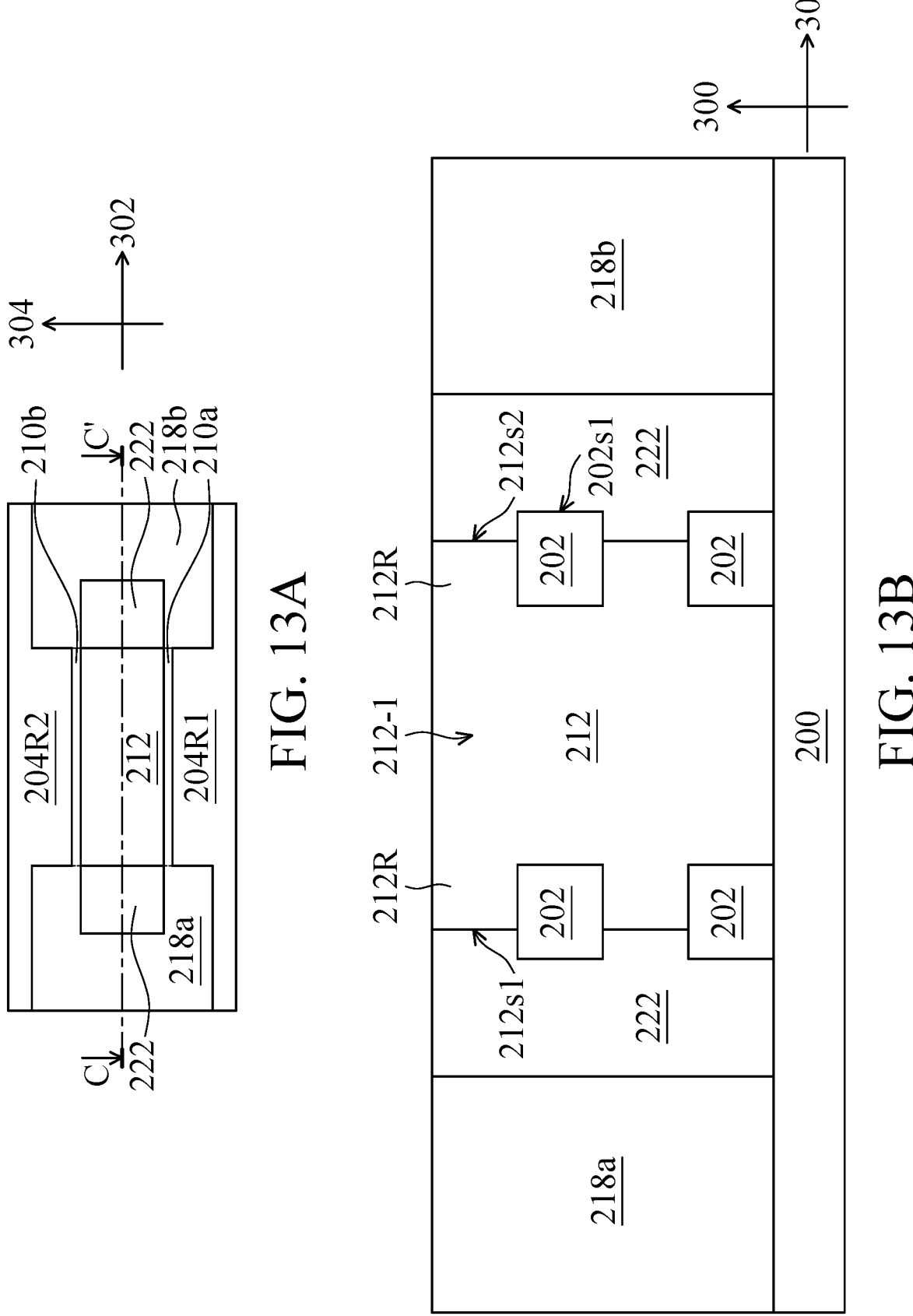

As shown in FIGS. 13A and 13B, the trenches 220a and 220b are filled with a polysilicon material 222. The polysilicon material 222 of the first conductive type (e.g., n-type), is in contact with the polysilicon pillar 212 of the second conductive type (e.g., p-type).

Figures 14A, 14B:
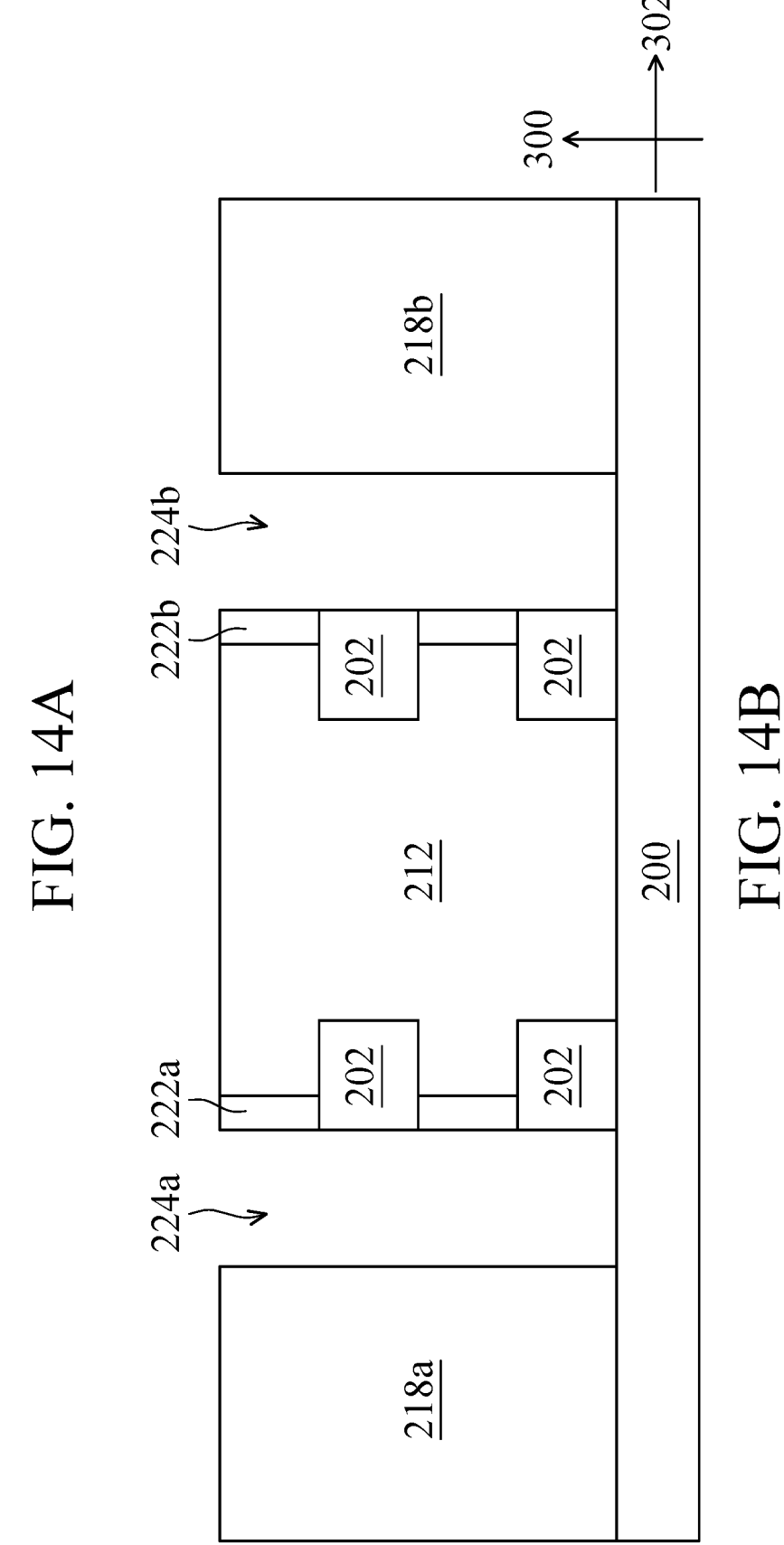

As shown in FIGS. 14A and 14B, portions of the polysilicon material 222 is removed to form trenches 224a and 224b through the insulating pillars 218a and 218b using an anisotropic etching process until the substrate 200 is exposed. The anisotropic etching process may leave remaining portions 222a and 222b of the polysilicon material 222 in contact with the horizontally protruding portions 212-1 of the polysilicon pillar 212. The remaining portions 222a and 222b are also referred to as the source electrode 222a and the drain electrode 222b.

Figures 15A, 15B:
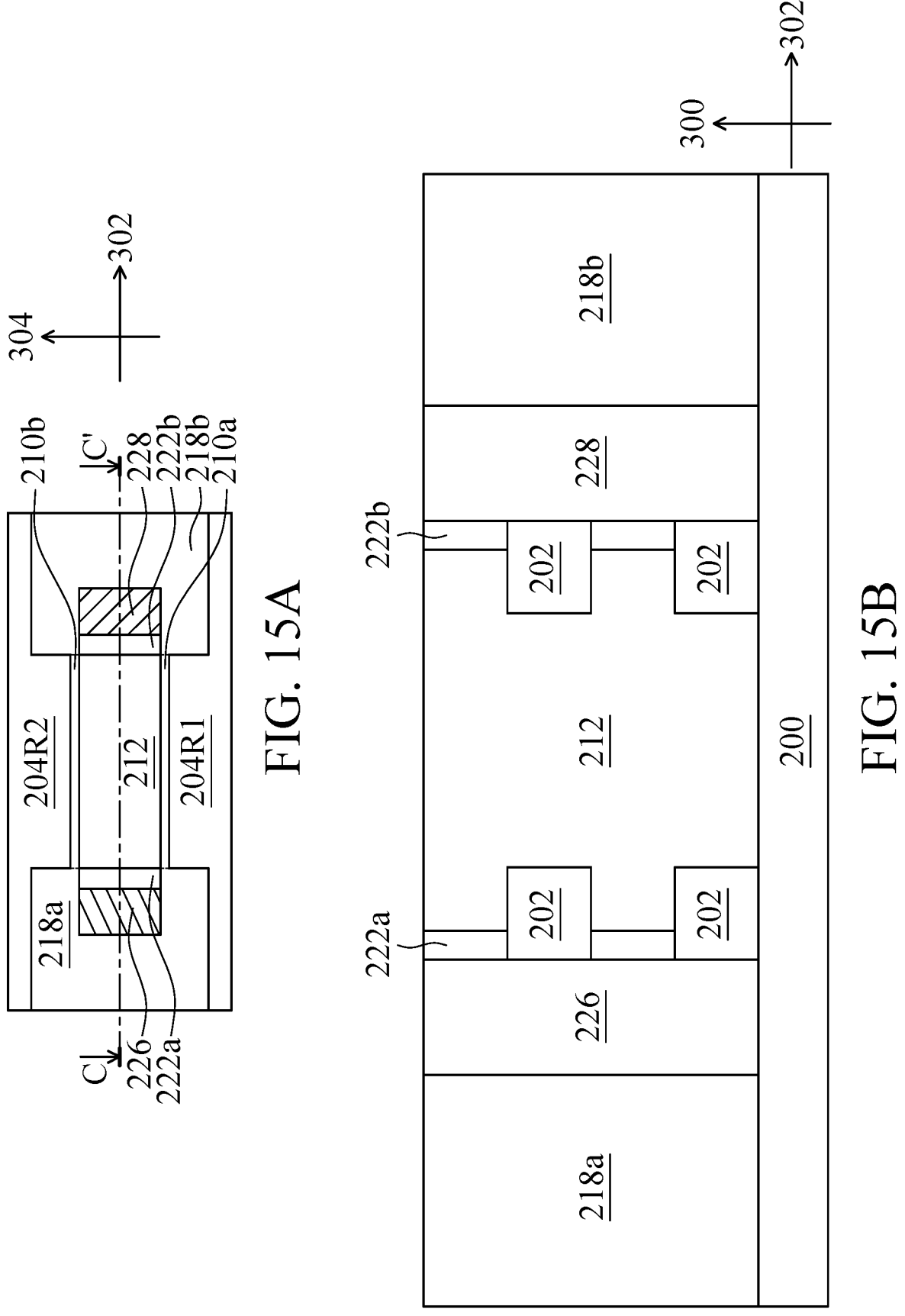

As shown in FIGS. 15A and 15B, the select line pillar 226 and the bit line pillar 228 are respectively formed through the alternating stack 206 and in contact with the source electrode 222a and the drain electrode 222b. The select line pillar 226 and the bit line pillar 228 vertically (in the direction 300) extend through the whole alternating stack 206 and serve as the common select line and common bit line of the vertically stacked memory cells 260.

Figures 16A, 16B:
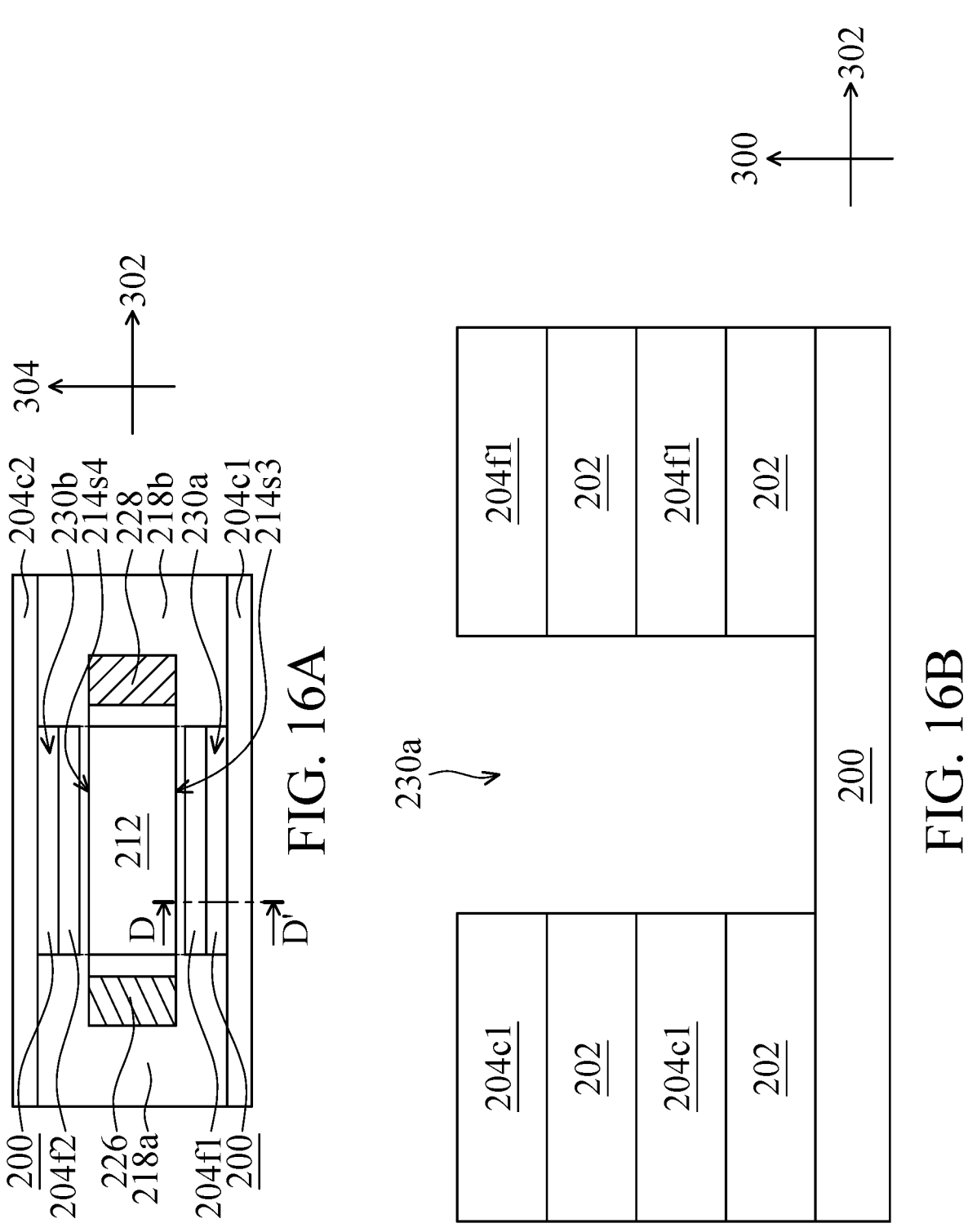

As shown in FIGS. 16A and 16B, portions of the alternating stack 206 outside the opposite sidewalls 212s3 and 212s4 are removed to form trenches 230a and 230b until the substrate 200 is exposed using an anisotropic etching process. The trenches 230a and 230b are formed to define the positions of the blocking dielectric (the first high-k dielectric pillar 232a and the second high-k dielectric pillar 232b) between the floating gate and the control gate of the memory cell 260.

During the formation of the trenches 230a and 230b, the polysilicon layers 204R1 of the alternating stack 206 are etched to form the first floating gates 204f1, the second floating gates 204f2, the first control gates 204c1 and the second control gates 204c2. The first floating gates 204f1 and the second floating gates 204f2 are adjacent to opposite sidewalls 212s3 and 212s4 and in contact with the tunneling dielectric layers 210a and 210b. The first control gates 204c1 and the second control gates 204c2 are respectively separated from the first floating gates 204f1 and the second floating gates 204f2 by the trenches 230a and 230b. The remaining polysilicon layers (including the first floating gates 204f1, the second floating gates 204f2, the first control gates 204c1 and the second control gates 204c2) and the insulating pillars 218a, 218b are exposed from sidewalls of the trenches 230a and 230b.

Figures 17A, 17B:
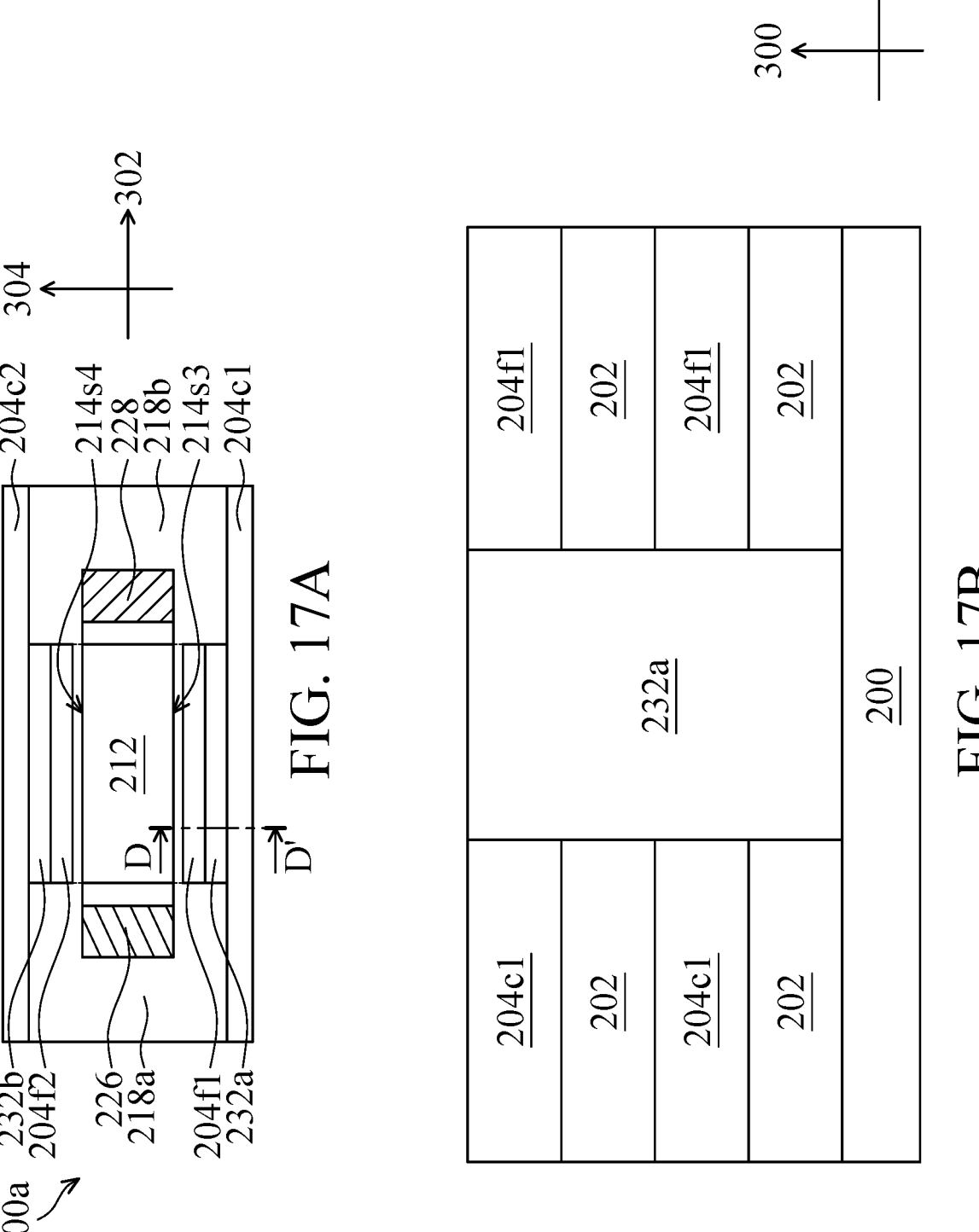

As shown in FIGS. 17A and 17B, the trenches 230a and 230b are filled with a high-k dielectric material to form the first high-k dielectric pillar 232a and the second high-k dielectric pillar 232b. Each of the memory cells 260 may be a double-gated memory cell 260 having two floating gates (the first floating gates 204f1 and the second floating gates 204f2) and two control gates (the first control gates 204c1 and the second control gates 204c2) disposed on the opposite sidewalls (the opposite sidewalls 212s3 and 212s4) of the channel region (the polysilicon pillar 212) of the memory cell 260 of the 3D flash memory device 500. After forming the first high-k dielectric pillar 232a and the second high-k dielectric pillar 232b, the fabrication of the 3D flash memory device 500a is complete.

Figures 18A, 18B:
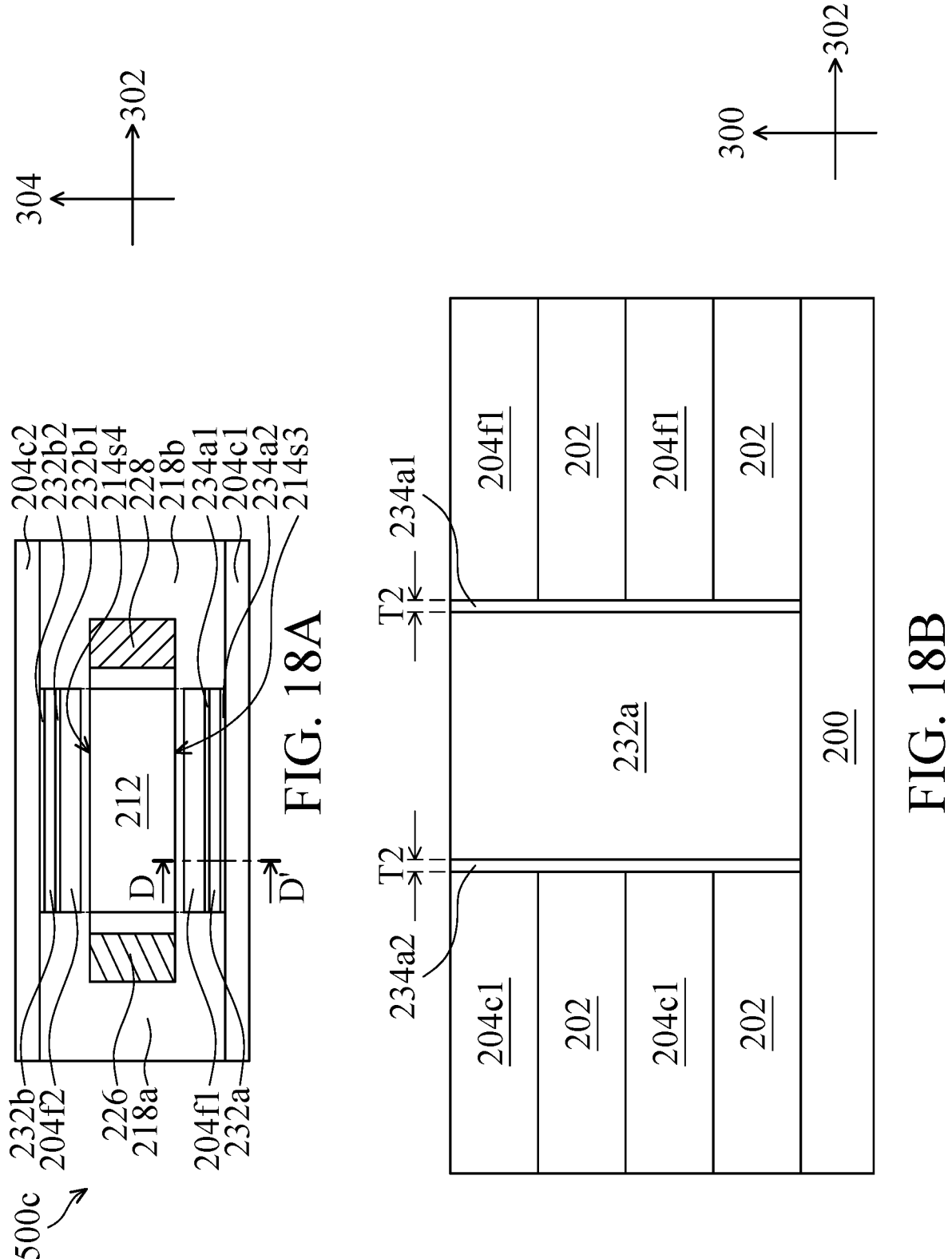

In some embodiments, as shown in FIGS. 18A and 18B, the first interfacial layers 234a1 and 234b1 and the second interfacial layers 234a2 and 234b2 are optionally formed along opposite sidewalls of the trenches 230a and 230b before forming the first high-k dielectric pillar 232a and the second high-k dielectric pillar 232b. Therefore, the first interfacial layer 234a1 is in contact with the first floating gate 204f1 and the first high-k dielectric pillar 232a, the second interfacial layer 234a2 is in contact with the first control gate 204c1 and the first high-k dielectric pillar 232a. Similarly, the first interfacial layer 234b1 is in contact with the second floating gate 204f2 and the second high-k dielectric pillar 232b, the second interfacial layer 234a2 is in contact with the second control gate 204c2 and the second high-k dielectric pillar 232b. The first high-k dielectric pillar 232a, the first interfacial layer 234a1 and the second interfacial layer 234a2 may collectively form as a composite blocking dielectric structure. The second high-k dielectric pillar 232b, the first interfacial layer 234b1 and the second interfacial layer 234b2 may collectively form as another composite blocking dielectric structure. The capacitance value of the composite blocking dielectric structure could be modified by changing the thickness and compositions of the high-k dielectric pillar (including the first high-k dielectric pillar 232a or the second high-k dielectric pillar 232b), the first interfacial layer (including the first interfacial layers 234a1 or 234b1) and the second interfacial layer (including the second interfacial layers 234a2 or 234b2). In some embodiments, the thicknesses T2 of the first interfacial layers 234a1 and 234b1 and the second interfacial layers 234a2 and 234b2 are in a range from about 1 nm to about 5 nm. After forming the first interfacial layers 234a1 and 234b1 and the second interfacial layers 234a2 and 234b2, the fabrication of a 3D flash memory device 500c is complete.

In some embodiments, as shown in FIGS. 19A and 19B, the first control gates 204c1 and the second control gates 204c2 may be optionally replaced with a metal material, thereby forming metal control gates 240a and 240b. After forming the metal control gates 240a and 240b, the fabrication of a 3D flash memory device 500d is complete.

Embodiments provide high density three-dimensional (3D) flash memory devices. The 3D flash memory device is formed in the alternating stack of insulating layers and polysilicon layers. The 3D flash memory device includes memory cells vertically stacked over the top surface of the substrate. Each of the memory cells is a double-gated flash memory cell, such that the short channel effect could be eliminated. In addition, the sources of the vertical stacked memory cells are electrically connected to the same select line pillar, and the drains of the vertical stacked memory cells are electrically connected to the same bit line pillar. The select line pillar and the bit line pillar vertically (in the z-direction) formed through the alternating stack could access the selected memory cell in a different layered level. In addition, the select line pillar and the bit line pillar provide additional heat dissipation paths for the vertical stacked memory cells of the 3D flash memory device. Furthermore, the selected memory cells in a different layered level could be accessed by the individual control gates (i.e. the word lines) extending in different x-y planes. In some embodiments, the control gate may have a T-shape in the top view for better cell isolation. Moreover, the floating gate in each memory cell of the 3D flash memory device is individual in order to improve the programming speed. In some embodiments, the high-k dielectric pillar is adopted as the blocking dielectric (also referred to as an inter-gate dielectric) to improve the programming speed of the 3D flash memory device. In addition, a wider trench (with a lower aspect ratio) is required in order to accommodate the high-k dielectric pillar between the floating gate and the control gate, so that the 3D flash memory devices may be more easily fabricated.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A three-dimensional flash memory device, comprising:
   a substrate;
   a T-shaped polysilicon pillar disposed on the substrate, wherein the T-shaped polysilicon pillar comprises a horizontally protruding portion extending substantially parallel to a top surface of the substrate and a vertically extending portion extending substantially vertical to the top surface of the substrate;
   a select line pillar and a bit line pillar vertically disposed on the substrate, wherein the select line pillar and the bit line pillar are adjacent to first opposite sidewalls of the horizontally protruding portion;
   a first control gate and a second control gate respectively adjacent to second opposite sidewalls of the horizontally protruding portion;
   a first floating gate laterally disposed between the horizontally protruding portion and the first control gate;
   a second floating gate laterally disposed between the horizontally protruding portion and the second control gate;

a first high-k dielectric pillar vertically disposed on the substrate and laterally disposed between the first floating gate and the first control gate; and a second high-k dielectric pillar vertically disposed on the substrate and laterally disposed between the second floating gate and the second control gate.

2. The three-dimensional flash memory device as claimed in claim 1, further comprising an insulating layer surrounding the vertically extending portion of the T-shaped polysilicon pillar.

3. The three-dimensional flash memory device as claimed in claim 2, further comprising an insulating pillar vertically disposed on the substrate and penetrating through the T-shaped polysilicon pillar.

4. The three-dimensional flash memory device as claimed in claim 1, further comprising:

a first interfacial layer disposed between the first floating gate and the high-k dielectric pillar; and a second interfacial layer disposed between the first control gate and the high-k dielectric pillar.

5. The three-dimensional flash memory device as claimed in claim 1, further comprising a source electrode and a drain electrode respectively positioned close to the first opposite sidewalls of the horizontally protruding portion of the T-shaped polysilicon pillar and in contact with the select line pillar and a bit line pillar.

6. The three-dimensional flash memory device as claimed in claim 5, wherein the horizontally protruding portion of the T-shaped polysilicon pillar, the source electrode, the drain electrode, the first floating gate, the second floating gate, the first control gate and the second control gate are in the same layered level.

7. The three-dimensional flash memory device as claimed in claim 1, wherein the first opposite sidewalls extend in a widthwise direction of the horizontally protruding portion, and the second opposite sidewalls are in a lengthwise direction of the horizontally protruding portion.

8. The three-dimensional flash memory device as claimed in claim 7, wherein lengths of the first control gate layer and the second control gate layer are respectively greater than lengths of the first floating gate layer and the second floating gate layer.

9. A three-dimensional flash memory device, comprising:

an alternating stack of insulating layers and polysilicon layers disposed over a substrate;

a polysilicon pillar extending through the alternating stack;

first insulating pillars extending through the alternating stack and adjacent to first opposite sidewalls of a horizontally protruding portion of the polysilicon pillar;

a select line pillar and a bit line pillar respectively extending through the first insulating pillars and adjacent to the first opposite sidewalls of the polysilicon pillar;

a first control gate and a second control gate respectively adjacent to second opposite sidewalls of the horizontally protruding portion of the polysilicon pillar and separated from the horizontally protruding portion of the polysilicon pillar by a first floating gate and a second floating gate;

a first high-k dielectric pillar extending through the alternating stack and interposed between the first control gate and the first floating gate; and a second high-k dielectric pillar extending through the alternating stack and interposed between the second control gate and the second floating gate.

10. The three-dimensional flash memory device as claimed in claim 9, wherein the polysilicon pillar further comprises a vertically extending portion connecting the horizontally protruding portion, wherein the horizontally protruding portion extends substantially parallel to a top surface of the substrate, and the vertically extending portion extends substantially vertical to the top surface of the substrate.

11. The three-dimensional flash memory device as claimed in claim 10, wherein the vertically extending portion of the polysilicon pillar is surrounded by one of the insulating layers of the alternating stack.

12. The three-dimensional flash memory device as claimed in claim 9, further comprising a second insulating pillar vertically disposed on the substrate and penetrating through the polysilicon pillar.

13. The three-dimensional flash memory device as claimed in claim 9, further comprising a first interfacial layer and a second interfacial layer along opposite sidewalls of the first high-k dielectric pillar, wherein the first high-k dielectric pillar is separated from the first floating gate and the first control gate by the first interfacial layer and the second interfacial layer, respectively.

14. The three-dimensional flash memory device as claimed in claim 9, wherein the first floating gate and the second floating gate are separated portions of one of the polysilicon layers.

15. The three-dimensional flash memory device as claimed in claim 14, wherein the first control gate and the second control gate are other separated portions of the one of the polysilicon layers.

16. The three-dimensional flash memory device as claimed in claim 9, wherein the first control gate and the second control gate are separated portions of a metal layer adjacent to the first insulating pillars and disposed between the insulating layers of the alternating stack.

* * * * *